US012156221B2

(12) United States Patent
Namgoong et al.

(10) Patent No.: US 12,156,221 B2
(45) Date of Patent: Nov. 26, 2024

(54) MACHINE LEARNING FOR ADDRESSING TRANSMIT (TX) NON-LINEARITY

(71) Applicant: QUALCOMM Incorporated, San Diego, CA (US)

(72) Inventors: June Namgoong, San Diego, CA (US); Taesang Yoo, San Diego, CA (US); Naga Bhushan, San Diego, CA (US); Krishna Kiran Mukkavilli, San Diego, CA (US); Tingfang Ji, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 280 days.

(21) Appl. No.: 17/181,927

(22) Filed: Feb. 22, 2021

(65) Prior Publication Data

US 2021/0266875 A1 Aug. 26, 2021

Related U.S. Application Data

(60) Provisional application No. 62/980,924, filed on Feb. 24, 2020.

(51) Int. Cl.
*H04W 72/04* (2023.01)
*G06N 3/08* (2023.01)
(Continued)

(52) U.S. Cl.
CPC ............ *H04W 72/23* (2023.01); *G06N 3/08* (2013.01); *H04W 64/003* (2013.01);
(Continued)

(58) Field of Classification Search
CPC .......... G06N 3/045; G06N 3/08; G06N 3/088; H03M 7/3059; H04L 27/26134;
(Continued)

(56) References Cited

U.S. PATENT DOCUMENTS 5,701,398 A * 12/1997 Glier ...................... G06N 3/045
706/41
10,621,494 B2 * 4/2020 Xu ........................ G06F 30/367
(Continued)

FOREIGN PATENT DOCUMENTS

CN 101072220 A 11/2007
CN 103001591 A 3/2013
(Continued)

OTHER PUBLICATIONS

Bo, T., et al., "A Clipping-Noise Compression Method to Reduce PAPR of OFDM Signals", IEEE Communications Letters, IEEE Service center, Piscataway, NJ, US, vol. 23, No. 8, Aug. 1, 2019 (Aug. 1, 2019), XP011739250, pp. 1389-1392, ISSN: 1089-7798, DOI: 10.1109/LCOMM.2019.2916052 [retrieved on Aug. 9, 2019].
(Continued)

*Primary Examiner* — Awet Haile
(74) *Attorney, Agent, or Firm* — QUALCOMM Incorporated

(57) ABSTRACT

A method of wireless communication by a transmitting device transforms a transmit waveform by an encoder neural network to control power amplifier (PA) operation with respect to non-linearities. The method also transmits the transformed transmit waveform across a propagation channel. A method of wireless communication by a receiving device receives a waveform transformed by an encoder neural network. The method also recovers, with a decoder neural network, the encoder input symbols from the received waveform. A transmitting device for wireless communication calculates distortion error based on a non-distorted digital transmit waveform and a distorted digital transmit waveform. The transmitting device also compresses the distortion error with an encoder neural network of an auto-encoder. The transmitting device transmits to a receiv-
(Continued)

ing device the compressed distortion error to compensate for power amplifier (PA) non-linearity.

28 Claims, 16 Drawing Sheets

(51) Int. Cl.
| | |
|---|---|
| *H04W 64/00* | (2009.01) |
| *H04W 72/12* | (2023.01) |
| *H04W 72/23* | (2023.01) |
| *H04W 72/52* | (2023.01) |
| *H04W 72/54* | (2023.01) |
| *H04W 84/02* | (2009.01) |

(52) U.S. Cl.
CPC ........... *H04W 72/52* (2023.01); *H04W 72/54* (2023.01); *H04W 84/02* (2013.01)

(58) Field of Classification Search
CPC ........... H04L 27/2618; H04L 27/2624; H04W 64/003; H04W 72/23; H04W 72/52; H04W 72/54; H04W 84/02
See application file for complete search history.

(56) References Cited

U.S. PATENT DOCUMENTS

| | | | | |
|---|---|---|---|---|
| 2005/0130664 | A1* | 6/2005 | Sang | H04W 72/542 |
| | | | | 455/450 |
| 2007/0206698 | A1* | 9/2007 | Yu | H04L 5/0023 |
| | | | | 375/267 |
| 2013/0243122 | A1 | 9/2013 | Bai | |
| 2017/0264468 | A1* | 9/2017 | Millar | H04B 10/61 |
| 2019/0097865 | A1* | 3/2019 | Xu | A61B 5/113 |
| 2020/0295975 | A1* | 9/2020 | Li | H03F 1/32 |
| 2020/0334542 | A1* | 10/2020 | Hoydis | G06F 17/18 |
| 2021/0089909 | A1* | 3/2021 | Binkowski | G10L 13/02 |
| 2021/0111936 | A1* | 4/2021 | Sahin | G06N 3/048 |
| 2022/0376956 | A1* | 11/2022 | Wesemann | H04L 25/0256 |
| 2022/0385317 | A1* | 12/2022 | Jung | H03F 1/30 |
| 2022/0393913 | A1* | 12/2022 | Orhan | H04L 27/2657 |
| 2022/0416937 | A1* | 12/2022 | Andrews | H04B 1/0003 |

FOREIGN PATENT DOCUMENTS

| | | | | |
|---|---|---|---|---|
| CN | 113269216 A | * | 8/2021 | ......... G06K 9/00523 |
| EP | 2538553 A1 | | 12/2012 | |
| JP | 2001274768 A | | 10/2001 | |

OTHER PUBLICATIONS

Bo, T., et al., "Iterative Clipping-Noise Compression Scheme for PAPR Reduction in OFDM Systems", IEEE Access, vol. 7, Sep. 30, 2019 (Sep. 30, 2019), XP011747894, pp. 134348-134359, DOI: 10.1109/ACCESS.2019.2941389 [retrieved on Sep. 30, 2019].

International Search Report and Written Opinion—PCT/US2021/019277—ISA/EPO—Aug. 19, 2021.

Henkel W., et al., "Peak-to-Average Ratio Reduction with Tone Reservation in Multi-User and MIMO OFDM", Communications in China (ICCC), 2012 1st IEEE International Conference on, IEEE, Aug. 15, 2012 (Aug. 15, 2012), pp. 372-376, XP032268032, DOI: 10.1109/ICCCHINA.2012.6356910 ISBN: 978-1-4673-2814-2.

Li L., et al., "Improved Tone Reservation Method Based on Deep Learning for PAPR Reduction in OFDM System", 2019, 11TH International Conference on Wireless Communications and Signal Processing (WCSP), IEEE, Oct. 23, 2019 (Oct. 23, 2019), 6 pages, XP033671896, DOI: 10.1109/WCSP.2019.8928103 [retrieved on Dec. 6, 2019].

Ohta M., et al., "PAPR Reduction of OFDM Signal by Neural Networks Without Side Information and its FPGA Implementation", Electronics and Communications in Japan, Scripta Technica, New York, US, vol. 91, No. 4, Apr. 1, 2008 (Apr. 1, 2008), pp. 52-60, XP001523147, DOI: 10.1002/ECJ.10081.

Partial International Search Report—PCT/US2021/019277—ISA/EPO—May 21, 2021.

Wang B., et al., "A Novel Tone Reservation Scheme Based on Deep Learning for PAPR Reduction in OFDM Systems", IEEE Communications Letters, IEEE Service Center, Piscataway, NJ, US, vol. 24, No. 6, Mar. 16, 2020 (Mar. 16, 2020), pp. 1271-1274, XP011792018, ISSN: 1089-7798, DOI: 10.1109/LCOMM.2020.2980832, [retrieved on Jun. 10, 2020].

Taiwan Search Report—TW110106394—TIPO—May 6, 2024.

\* cited by examiner

MACHINE LEARNING FOR ADDRESSING TRANSMIT (TX) NON-LINEARITY

CROSS-REFERENCE TO RELATED APPLICATION

The present application claims priority to U.S. Provisional Patent Application No. 62/980,924, filed on Feb. 24, 2020, and titled "MACHINE LEARNING FOR ADDRESSING TRANSMIT (Tx) NON-LINEARITY," the disclosure of which is expressly incorporated by reference herein in its entirety.

FIELD OF THE DISCLOSURE

Aspects of the present disclosure generally relate to wireless communications, and more particularly to machine learning to address transmit (Tx) non-linearity.

BACKGROUND

Wireless communications systems are widely deployed to provide various telecommunications services such as telephony, video, data, messaging, and broadcasts. Typical wireless communications systems may employ multiple-access technologies capable of supporting communications with multiple users by sharing available system resources (e.g., bandwidth, transmit power, and/or the like). Examples of such multiple-access technologies include code-division multiple access (CDMA) systems, time-division multiple access (TDMA) systems, frequency-division multiple access (FDMA) systems, orthogonal frequency-division multiple access (OFDMA) systems, single-carrier frequency-division multiple access (SC-FDMA) systems, time-division synchronous code-division multiple access (TD-SCDMA) systems, and long term evolution (LTE). LTE/LTE-Advanced is a set of enhancements to the universal mobile telecommunications system (UMTS) mobile standard promulgated by the Third Generation Partnership Project (3GPP).

A wireless communications network may include a number of base stations (BSs) that can support communications for a number of user equipment (UEs). A user equipment (UE) may communicate with a base station (BS) via the downlink and uplink. The downlink (or forward link) refers to the communications link from the BS to the UE, and the uplink (or reverse link) refers to the communications link from the UE to the BS. As will be described in more detail herein, a BS may be referred to as a Node B, a gNB, an access point (AP), a radio head, a transmit receive point (TRP), a New Radio (NR) BS, a 5G Node B, and/or the like.

The above multiple access technologies have been adopted in various telecommunications standards to provide a common protocol that enables different user equipment to communicate on a municipal, national, regional, and even global level. New Radio (NR), which may also be referred to as 5G, is a set of enhancements to the LTE mobile standard promulgated by the Third Generation Partnership Project (3GPP). NR is designed to better support mobile broadband Internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink (DL), using CP-OFDM and/or SC-FDM (e.g., also known as discrete Fourier transform spread OFDM (DFT-s-OFDM)) on the uplink (UL), as well as supporting beamforming, multiple-input multiple-output (MIMO) antenna technology, and carrier aggregation. However, as the demand for mobile broadband access continues to increase, there exists a need for further improvements in NR and LTE technologies. Preferably, these improvements should be applicable to other multiple access technologies and the telecommunications standards that employ these technologies.

Artificial neural networks may comprise interconnected groups of artificial neurons (e.g., neuron models). The artificial neural network may be a computational device or represented as a method to be performed by a computational device. Convolutional neural networks, such as deep convolutional neural networks, are a type of feed-forward artificial neural network. Convolutional neural networks may include layers of neurons that may be configured in a tiled receptive field. It would be desirable to apply neural network processing to wireless communications to achieve greater efficiencies.

SUMMARY

In some aspects of the present disclosure, a method of wireless communication by a transmitting device may include transforming a transmit waveform by an encoder neural network to control power amplifier (PA) operation with respect to non-linearities. The method may also include transmitting the transformed transmit waveform across a propagation channel.

In other aspects of the present disclosure, a method of wireless communication by a receiving device may include receiving a waveform transformed by an encoder neural network. The method may also include recovering, with a decoder neural network, the encoder input symbols from the received waveform.

In some aspects of the present disclosure, a method at a transmitting device may include calculating distortion error based on a non-distorted digital transmit waveform and a distorted digital transmit waveform. The method may also compress the distortion error with an encoder neural network of an auto-encoder. The method may further include transmitting to a receiving device the compressed distortion error to compensate for power amplifier (PA) non-linearity.

In still other aspects of the present disclosure, a method at a receiving device may include decompressing, with a decoder neural network of an auto-encoder, a distortion error caused by a power amplifier (PA). The method may also include recovering an undistorted signal based on the decompressed distortion error.

In some aspects of the present disclosure, a transmitting device for wireless communication may include a memory and at least one processor operatively coupled to the memory. The memory and the at least one processor may be configured to transform a transmit waveform by an encoder neural network to control power amplifier (PA) operation with respect to non-linearities. The memory and processor(s) may also be configured to transmit the transformed transmit waveform across a propagation channel.

In some aspects of the present disclosure, a receiving device for wireless communication may include a memory and at least one processor operatively coupled to the memory. The memory and the at least one processor may be configured to receive a waveform transformed by an encoder neural network. The memory and the processor(s) may also be configured to recover, with a decoder neural network, encoder input symbols from the received waveform.

In still other aspects of the present disclosure, a transmitting device for wireless communication may include a memory and at least one processor operatively coupled to the memory. The memory and the at least one processor may be configured to calculate distortion error based on a non-distorted digital transmit waveform and a distorted digital transmit waveform. The memory and processor(s) may also be configured to compress the distortion error with an encoder neural network of an auto-encoder, and transmit to a receiving device the compressed distortion error to compensate for power amplifier (PA) non-linearity.

In some aspects of the present disclosure, a receiving device for wireless communication may include a memory and at least one processor operatively coupled to the memory. The memory and the at least one processor may be configured to decompress, with a decoder neural network of an auto-encoder, a distortion error caused by a power amplifier (PA). The memory and processor(s) may also be configured to recover an undistorted signal based on the decompressed distortion error.

In other aspects of the present disclosure, a transmitting device for wireless communication may include means for transforming a transmit waveform by an encoder neural network to control power amplifier (PA) operation with respect to non-linearities. The transmitting device may also include means for transmitting the transformed transmit waveform across a propagation channel.

In aspects of the present disclosure, a receiving device for wireless communication may include means for receiving a waveform transformed by an encoder neural network. The receiving device may also include means for recovering, with a decoder neural network, the encoder input symbols from the received waveform.

In some aspects of the present disclosure, a transmitting device for wireless communication may include means for calculating distortion error based on a non-distorted digital transmit waveform and a distorted digital transmit waveform. The transmitting device may also include means for compressing the distortion error with an encoder neural network of an auto-encoder. The transmitting device may further include means for transmitting, to a receiving device, the compressed distortion error to compensate for power amplifier (PA) non-linearity.

In still other aspects of the present disclosure, a receiving device for wireless communication may include means for decompressing, with a decoder neural network of an auto-encoder, a distortion error caused by a power amplifier (PA). The receiving device may also include means for recovering an undistorted signal based on the decompressed distortion error.

In aspects of the present disclosure, a non-transitory computer-readable medium may include program code executed by a user equipment (UE). The medium may include program code to transform a transmit waveform by an encoder neural network to control power amplifier (PA) operation with respect to non-linearities. The medium may also include program code to transmit the transformed transmit waveform across a propagation channel.

In some aspects of the present disclosure, a non-transitory computer-readable medium may include program code executed by a receiving device. The medium may include program code to receive a waveform transformed by an encoder neural network. The medium may also include program code to recover, with a decoder neural network, encoder input symbols from the received waveform.

In further aspects of the present disclosure, a non-transitory computer-readable medium may include program code executed by a transmitting device. The medium may include program code to calculate distortion error based on a non-distorted digital transmit waveform and a distorted digital transmit waveform. The medium may also include program code to compress the distortion error with an encoder neural network of an auto-encoder. The medium may further include program code to transmit, to a receiving device, the compressed distortion error to compensate for power amplifier (PA) non-linearity.

In still further aspects of the present disclosure, a non-transitory computer-readable medium may include program code executed by a receiving device. The medium may include program code to decompress, with a decoder neural network of an auto-encoder, a distortion error caused by a power amplifier (PA). The medium may also include program code to recover an undistorted signal based on the decompressed distortion error.

Aspects generally include a method, apparatus, system, computer program product, non-transitory computer-readable medium, user equipment, base station, wireless communications device, and processing system as substantially described with reference to and as illustrated by the accompanying drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Various aspects of the disclosure are described more fully below with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth. In addition, the scope of the disclosure is intended to cover such an apparatus or method, which is practiced using other structure, functionality, or structure and functionality in addition to or other than the various aspects of the disclosure set forth. It should be understood that any aspect of the disclosure disclosed may be embodied by one or more elements of a claim.

Several aspects of telecommunications systems will now be presented with reference to various apparatuses and techniques. These apparatuses and techniques will be described in the following detailed description and illustrated in the accompanying drawings by various blocks, modules, components, circuits, steps, processes, algorithms, and/or the like (collectively referred to as "elements"). These elements may be implemented using hardware, software, or combinations thereof. Whether such elements are implemented as hardware or software depends upon the particular application and design constraints imposed on the overall system.

It should be noted that while aspects may be described using terminology commonly associated with 5G and later wireless technologies, aspects of the present disclosure can be applied in other generation-based communications systems, such as and including 3G and/or 4G technologies.

Figure 1:
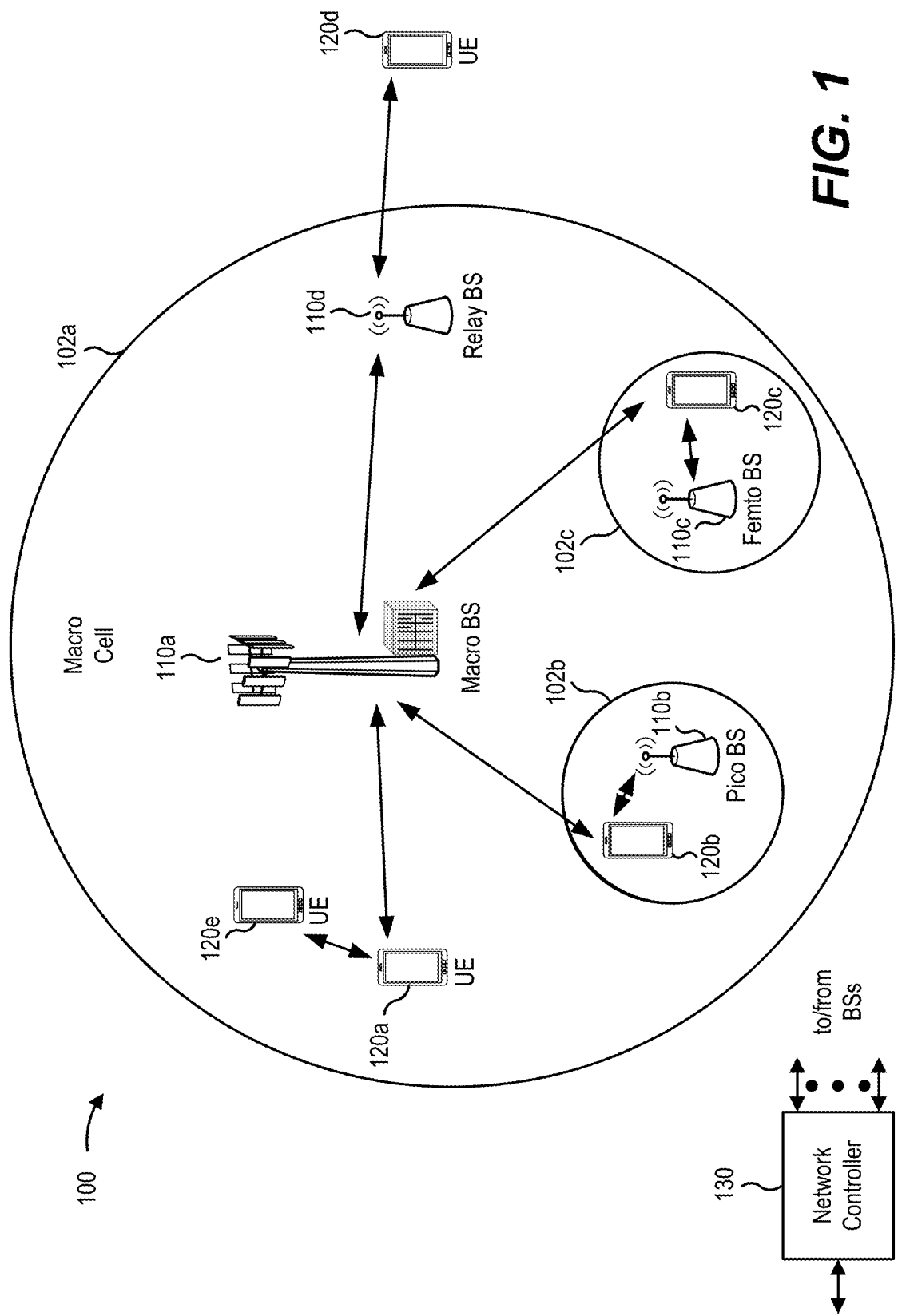
FIG. 1 is a block diagram conceptually illustrating an example of a wireless communications network, in accordance with various aspects of the present disclosure.

FIG. 1 is a diagram illustrating a network 100 in which aspects of the present disclosure may be practiced. The network 100 may be a 5G or NR network or some other wireless network, such as an LTE network. Wireless network 100 may include a number of BSs 110 (shown as BS 110a, BS 110b, BS 110c, and BS 110d) and other network entities. A BS is an entity that communicates with user equipment (UEs) and may also be referred to as a base station, a NR BS, a Node B, a gNB, a 5G node B (NB), an access point, a transmit receive point (TRP), and/or the like. Each BS may provide communications coverage for a particular geographic area. In 3GPP, the term "cell" can refer to a coverage area of a BS and/or a BS subsystem serving this coverage area, depending on the context in which the term is used.

A BS may provide communications coverage for a macro cell, a pico cell, a femto cell, and/or another type of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a closed subscriber group (CSG)). A BS for a macro cell may be referred to as a macro BS. A BS for a pico cell may be referred to as a pico BS. A BS for a femto cell may be referred to as a femto BS or a home BS. In the example shown in FIG. 1, a BS 110a may be a macro BS for a macro cell 102a, a BS 110b may be a pico BS for a pico cell 102b, and a BS 110c may be a femto BS for a femto cell 102c. A BS may support one or multiple (e.g., three) cells. The terms "eNB," "base station," "NR BS," "gNB," "TRP," "AP," "node B," "5G NB," and "cell" may be used interchangeably herein.

In some aspects, a cell may not necessarily be stationary, and the geographic area of the cell may move according to the location of a mobile BS. In some aspects, the BSs may be interconnected to one another and/or to one or more other BSs or network nodes (not shown) in the wireless network 100 through various types of backhaul interfaces such as a direct physical connection, a virtual network, and/or the like using any suitable transport network.

Wireless network 100 may also include relay stations. A relay station is an entity that can receive a transmission of data from an upstream station (e.g., a BS or a UE) and send a transmission of the data to a downstream station (e.g., a UE or a BS). A relay station may also be a UE that can relay transmissions for other UEs. In the example shown in FIG. 1, a relay station 110d may communicate with macro BS 110a and a UE 120d in order to facilitate communications between BS 110a and UE 120d. A relay station may also be referred to as a relay BS, a relay base station, a relay, and/or the like.

Wireless network 100 may be a heterogeneous network that includes BSs of different types, e.g., macro BSs, pico BSs, femto BSs, relay BSs, and/or the like. These different types of BSs may have different transmit power levels, different coverage areas, and different impact on interference in wireless network 100. For example, macro BSs may have a high transmit power level (e.g., 5 to 40 Watts) whereas pico BSs, femto BSs, and relay BSs may have lower transmit power levels (e.g., 0.1 to 2 Watts).

A network controller 130 may couple to a set of BSs and may provide coordination and control for these BSs. Network controller 130 may communicate with the BSs via a backhaul. The BSs may also communicate with one another, e.g., directly or indirectly via a wireless or wireline backhaul.

UEs 120 (e.g., 120a, 120b, 120c) may be dispersed throughout wireless network 100, and each UE may be stationary or mobile. A UE may also be referred to as an access terminal, a terminal, a mobile station, a subscriber unit, a station, and/or the like. A UE may be a cellular phone (e.g., a smart phone), a personal digital assistant (PDA), a wireless modem, a wireless communications device, a handheld device, a laptop computer, a cordless phone, a wireless local loop (WLL) station, a tablet, a camera, a gaming device, a netbook, a smartbook, an ultrabook, a medical device or equipment, biometric sensors/devices, wearable devices (smart watches, smart clothing, smart glasses, smart wrist bands, smart jewelry (e.g., smart ring, smart bracelet)), an entertainment device (e.g., a music or video device, or a satellite radio), a vehicular component or sensor, smart meters/sensors, industrial manufacturing equipment, a global positioning system device, or any other suitable device that is configured to communicate via a wireless or wired medium.

Some UEs may be considered machine-type communications (MTC) or evolved or enhanced machine-type communications (eMTC) UEs. MTC and eMTC UEs include, for example, robots, drones, remote devices, sensors, meters, monitors, location tags, and/or the like, that may communicate with a base station, another device (e.g., remote device), or some other entity. A wireless node may provide, for example, connectivity for or to a network (e.g., a wide area network such as Internet or a cellular network) via a wired or wireless communications link. Some UEs may be considered Internet-of-Things (IoT) devices, and/or may be implemented as NB-IoT (narrowband internet of things) devices. Some UEs may be considered a customer premises equipment (CPE). UE 120 may be included inside a housing that houses components of UE 120, such as processor components, memory components, and/or the like.

In general, any number of wireless networks may be deployed in a given geographic area. Each wireless network may support a particular RAT and may operate on one or more frequencies. A RAT may also be referred to as a radio technology, an air interface, and/or the like. A frequency may also be referred to as a carrier, a frequency channel, and/or the like. Each frequency may support a single RAT in a given geographic area in order to avoid interference between wireless networks of different RATs. In some cases, NR or 5G RAT networks may be deployed.

In some aspects, two or more UEs 120 (e.g., shown as UE 120a and UE 120e) may communicate directly using one or more sidelink channels (e.g., without using a base station 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol, a vehicle-to-infrastructure (V2I) protocol, and/or the like), a mesh network, and/or the like. In this case, the UE 120 may perform scheduling operations, resource selection operations, and/or other operations described elsewhere herein as being performed by the base station 110.

As indicated above, FIG. 1 is provided merely as an example. Other examples may differ from what is described with regard to FIG. 1.

Figure 2:
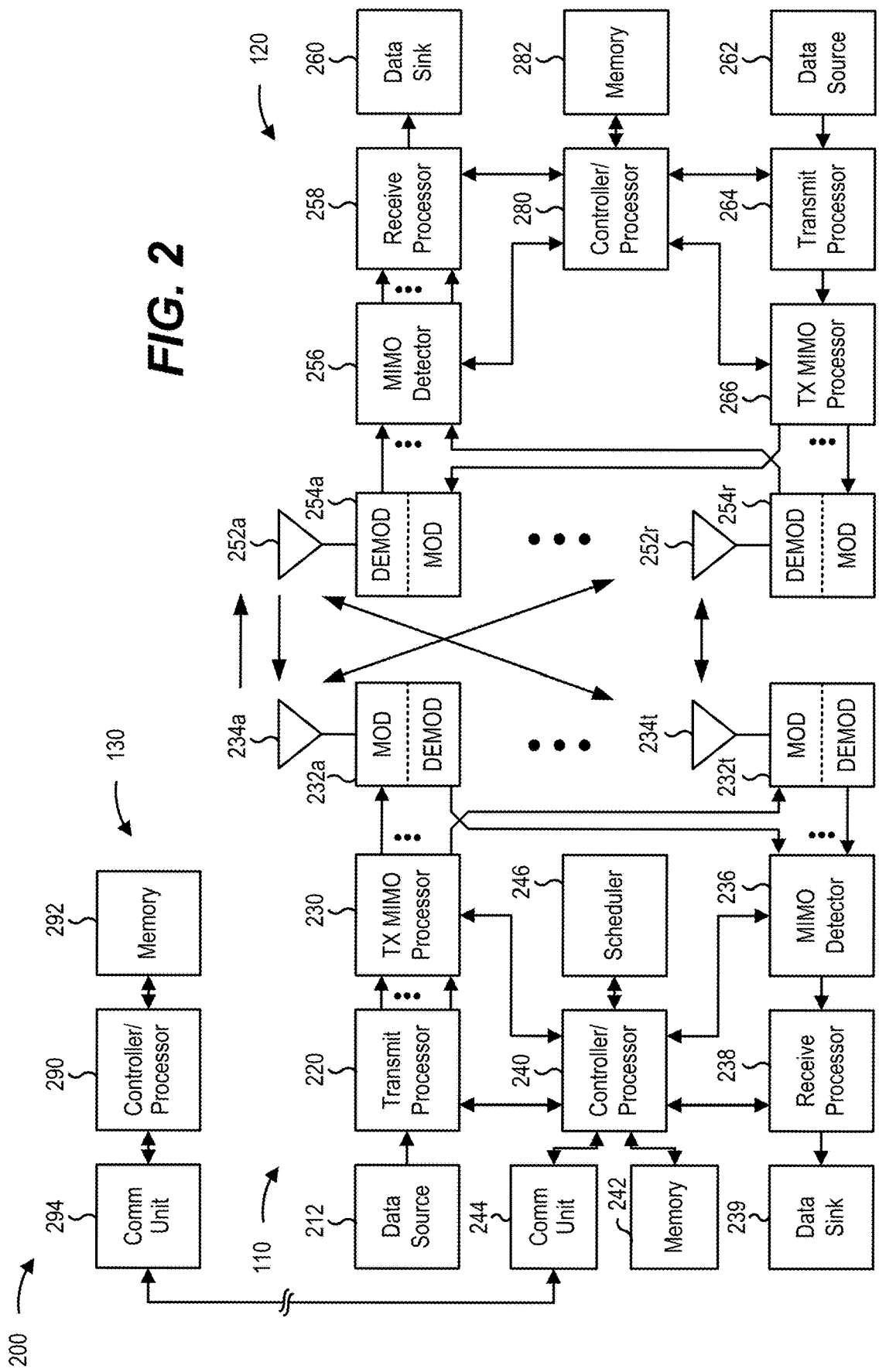
FIG. 2 is a block diagram conceptually illustrating an example of a base station in communication with a user equipment (UE) in a wireless communications network, in accordance with various aspects of the present disclosure.

FIG. 2 shows a block diagram of a design 200 of base station 110 and UE 120, which may be one of the base stations and one of the UEs in FIG. 1. Base station 110 may be equipped with T antennas 234a through 234t, and UE 120 may be equipped with R antennas 252a through 252r, where in general T≥1 and R≥1.

At base station 110, a transmit processor 220 may receive data from a data source 212 for one or more UEs, select one or more modulation and coding schemes (MCS) for each UE based at least in part on channel quality indicators (CQIs) received from the UE, process (e.g., encode and modulate) the data for each UE based at least in part on the MCS(s) selected for the UE, and provide data symbols for all UEs. Transmit processor 220 may also process system information (e.g., for semi-static resource partitioning information (SRPI) and/or the like) and control information (e.g., CQI requests, grants, upper layer signaling, and/or the like) and provide overhead symbols and control symbols. Transmit processor 220 may also generate reference symbols for reference signals (e.g., the cell-specific reference signal (CRS)) and synchronization signals (e.g., the primary synchronization signal (PSS) and secondary synchronization signal (SSS)). A transmit (TX) multiple-input multiple-output (MIMO) processor 230 may perform spatial processing (e.g., pre-coding) on the data symbols, the control symbols, the overhead symbols, and/or the reference symbols, if applicable, and may provide T output symbol streams to T modulators (MODs) 232a through 232t. Each modulator 232 may process a respective output symbol stream (e.g., for OFDM and/or the like) to obtain an output sample stream. Each modulator 232 may further process (e.g., convert to analog, amplify, filter, and upconvert) the output sample stream to obtain a downlink signal. T downlink signals from modulators 232a through 232t may be transmitted via T antennas 234a through 234t, respectively. According to various aspects described in more detail below, the synchronization signals can be generated with location encoding to convey additional information.

At UE 120, antennas 252a through 252r may receive the downlink signals from base station 110 and/or other base stations and may provide received signals to demodulators (DEMODs) 254a through 254r, respectively. Each demodulator 254 may condition (e.g., filter, amplify, downconvert, and digitize) a received signal to obtain input samples. Each demodulator 254 may further process the input samples (e.g., for OFDM and/or the like) to obtain received symbols. A MIMO detector 256 may obtain received symbols from all R demodulators 254a through 254r, perform MIMO detection on the received symbols if applicable, and provide detected symbols. A receive processor 258 may process (e.g., demodulate and decode) the detected symbols, provide decoded data for UE 120 to a data sink 260, and provide decoded control information and system information to a controller/processor 280. A channel processor may determine reference signal received power (RSRP), received signal strength indicator (RSSI), reference signal received quality (RSRQ), channel quality indicator (CQI), and/or the like. In some aspects, one or more components of UE 120 may be included in a housing.

On the uplink, at UE 120, a transmit processor 264 may receive and process data from a data source 262 and control information (e.g., for reports comprising RSRP, RSSI, RSRQ, CQI, and/or the like) from controller/processor 280. Transmit processor 264 may also generate reference symbols for one or more reference signals. The symbols from transmit processor 264 may be pre-coded by a TX MIMO processor 266 if applicable, further processed by modulators 254a through 254r (e.g., for DFT-s-OFDM, CP-OFDM, and/or the like), and transmitted to base station 110. At base station 110, the uplink signals from UE 120 and other UEs may be received by antennas 234, processed by demodulators 254, detected by a MIMO detector 236 if applicable, and further processed by a receive processor 238 to obtain decoded data and control information sent by UE 120. Receive processor 238 may provide the decoded data to a data sink 239 and the decoded control information to controller/processor 240. Base station 110 may include communications unit 244 and communicate to network controller 130 via communications unit 244. Network controller 130 may include communications unit 294, controller/processor 290, and memory 292.

Controller/processor 240 of base station 110, controller/processor 280 of UE 120, and/or any other component(s) of FIG. 2 may perform one or more techniques associated with machine learning for non-linearities, as described in more detail elsewhere, the disclosure of which is incorporated by reference herein in its entirety. For example, controller/processor 240 of base station 110, controller/processor 280 of UE 120, and/or any other component(s) of FIG. 2 may perform or direct operations of, for example, the processes 1200, 1300, 1400, 1500 of FIGS. 12-15 and/or other processes as described. Memories 242 and 282 may store data and program codes for base station 110 and UE 120, respectively. A scheduler 246 may schedule UEs for data transmission on the downlink and/or uplink.

In some aspects, UE 120 may include means for receiving, means for transmitting, means for calculating, means for compressing, means for decompressing, means for recovering, and means for transforming. Such means may include one or more components of the UE 120 or base station 110 described in connection with FIG. 2.

As indicated above, FIG. 2 is provided merely as an example. Other examples may differ from what is described with regard to FIG. 2.

In some cases, different types of devices supporting different types of applications and/or services may coexist in a cell. Examples of different types of devices include UE handsets, customer premises equipment (CPEs), vehicles, Internet of Things (IoT) devices, and/or the like. Examples of different types of applications include ultra-reliable low-latency communications (URLLC) applications, massive machine-type communications (mMTC) applications, enhanced mobile broadband (eMBB) applications, vehicle-to-anything (V2X) applications, and/or the like. Furthermore, in some cases, a single device may support different applications or services simultaneously.

Figure 3:
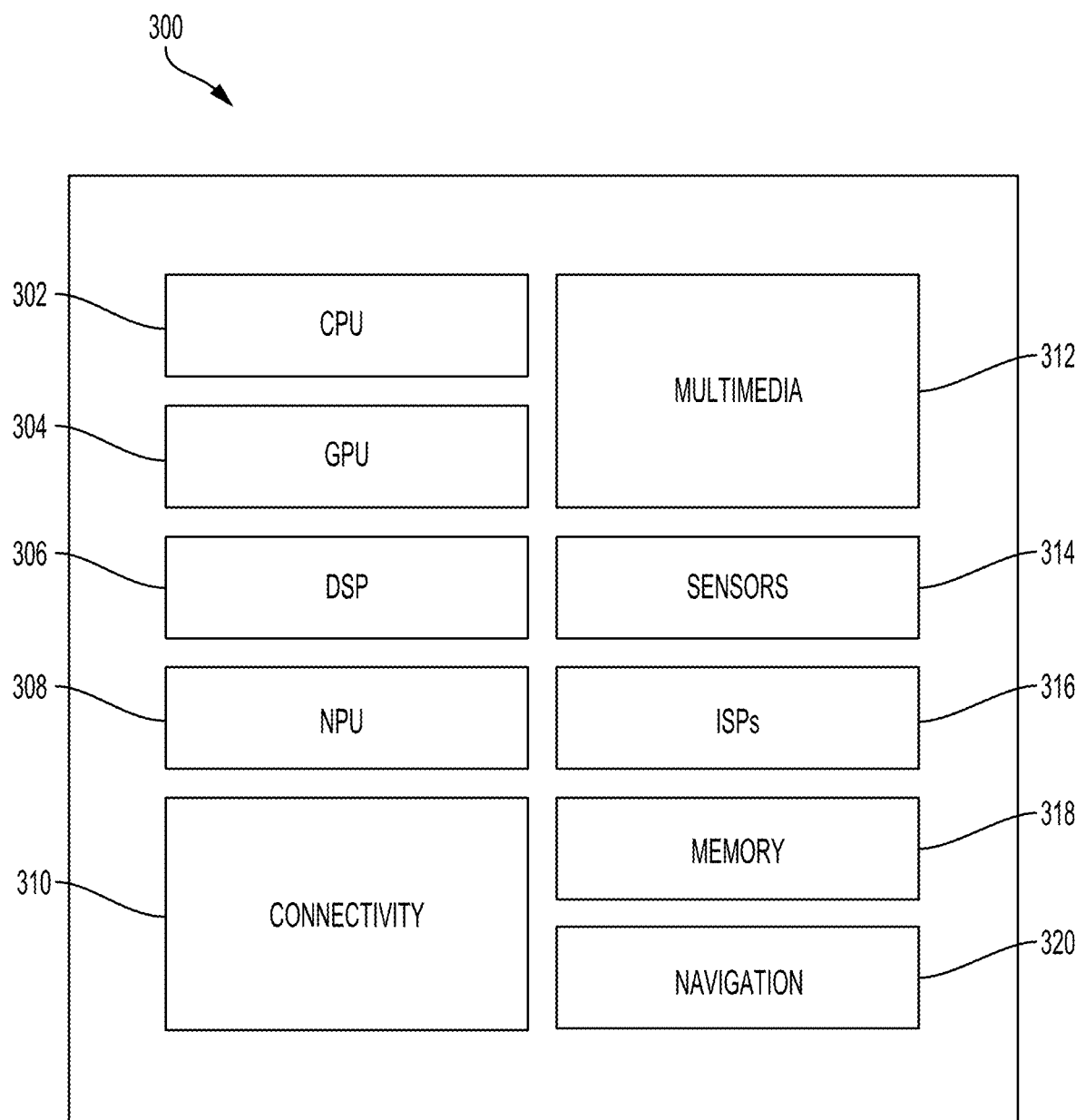
FIG. 3 illustrates an example implementation of designing a neural network using a system-on-a-chip (SOC), including a general-purpose processor in accordance with certain aspects of the present disclosure.

FIG. 3 illustrates an example implementation of a system-on-a-chip (SOC) 300, which may include a central processing unit (CPU) 302 or a multi-core CPU configured for machine learning to address non-linearities, in accordance with certain aspects of the present disclosure. The SOC 300 may be included in the base station 110 or UE 120. Variables (e.g., neural signals and synaptic weights), system parameters associated with a computational device (e.g., neural network with weights), delays, frequency bin information, and task information may be stored in a memory block associated with a neural processing unit (NPU) 108, in a memory block associated with a CPU 302, in a memory block associated with a graphics processing unit (GPU) 304, in a memory block associated with a digital signal processor (DSP) 306, in a memory block 318, or may be distributed across multiple blocks. Instructions executed at the CPU 302 may be loaded from a program memory associated with the CPU 302 or may be loaded from a memory block 318.

The SOC 300 may also include additional processing blocks tailored to specific functions, such as a GPU 304, a DSP 306, a connectivity block 310, which may include fifth generation (5G) connectivity, fourth generation long term evolution (4G LTE) connectivity, Wi-Fi connectivity, USB connectivity, Bluetooth connectivity, and the like, and a multimedia processor 312 that may, for example, detect and recognize gestures. In one implementation, the NPU is implemented in the CPU, DSP, and/or GPU. The SOC 300 may also include a sensor processor 314, image signal processors (ISPs) 316, and/or navigation module 320, which may include a global positioning system.

The SOC 300 may be based on an ARM instruction set. In an aspect of the present disclosure, the instructions loaded into the general-purpose processor 302 may comprise code to transform a transmit waveform by an encoder neural network to control power amplifier (PA) operation with respect to non-linearities; and code to transmit the transformed transmit waveform across a propagation channel. The instructions loaded into the general-purpose processor 302 may further comprise code to receive a waveform transformed by an encoder neural network; and code to recover, with a decoder neural network, encoder input symbols from the received waveform. The instructions loaded into the general-purpose processor 302 may comprise code to calculate distortion error based on a non-distorted digital transmit waveform and a distorted digital transmit waveform; code to compress the distortion error with an encoder neural network of an auto-encoder; and code to transmit, to a receiving device, the compressed distortion error to compensate for power amplifier (PA) non-linearity. The instructions loaded into the general-purpose processor 302 may also comprise code to decompress, with a decoder neural network of an auto-encoder, a distortion error caused by a power amplifier (PA); and code to recover an undistorted signal based on the decompressed distortion error.

Deep learning architectures may perform an object recognition task by learning to represent inputs at successively higher levels of abstraction in each layer, thereby building up a useful feature representation of the input data. In this way, deep learning addresses a major bottleneck of traditional machine learning. Prior to the advent of deep learning, a machine learning approach to an object recognition problem may have relied heavily on human engineered features, perhaps in combination with a shallow classifier. A shallow classifier may be a two-class linear classifier, for example, in which a weighted sum of the feature vector components may be compared with a threshold to predict to which class the input belongs. Human engineered features may be templates or kernels tailored to a specific problem domain by engineers with domain expertise. Deep learning architectures, in contrast, may learn to represent features that are similar to what a human engineer might design, but through training. Furthermore, a deep network may learn to represent and recognize new types of features that a human might not have considered.

A deep learning architecture may learn a hierarchy of features. If presented with visual data, for example, the first layer may learn to recognize relatively simple features, such as edges, in the input stream. In another example, if presented with auditory data, the first layer may learn to recognize spectral power in specific frequencies. The second layer, taking the output of the first layer as input, may learn to recognize combinations of features, such as simple shapes for visual data or combinations of sounds for auditory data. For instance, higher layers may learn to represent complex shapes in visual data or words in auditory data. Still higher layers may learn to recognize common visual objects or spoken phrases.

Deep learning architectures may perform especially well when applied to problems that have a natural hierarchical structure. For example, the classification of motorized vehicles may benefit from first learning to recognize wheels, windshields, and other features. These features may be combined at higher layers in different ways to recognize cars, trucks, and airplanes.

Neural networks may be designed with a variety of connectivity patterns. In feed-forward networks, information is passed from lower to higher layers, with each neuron in a given layer communicating to neurons in higher layers. A hierarchical representation may be built up in successive layers of a feed-forward network, as described above. Neural networks may also have recurrent or feedback (also called top-down) connections. In a recurrent connection, the output from a neuron in a given layer may be communicated to another neuron in the same layer. A recurrent architecture may be helpful in recognizing patterns that span more than one of the input data chunks that are delivered to the neural network in a sequence. A connection from a neuron in a given layer to a neuron in a lower layer is called a feedback (or top-down) connection. A network with many feedback connections may be helpful when the recognition of a high-level concept may aid in discriminating the particular low-level features of an input.

Figure 4A:
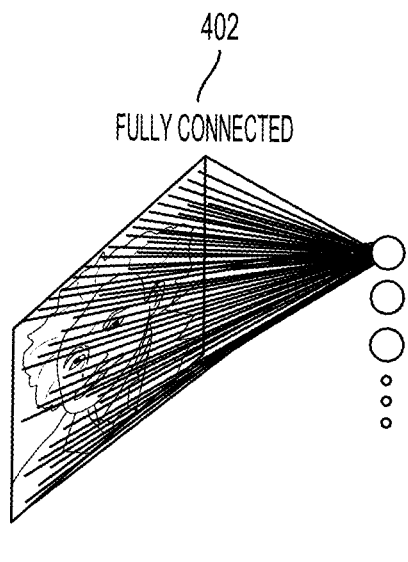
FIGS. 4A, 4B, and 4C are diagrams illustrating a neural network in accordance with aspects of the present disclosure.
Figure 4B:
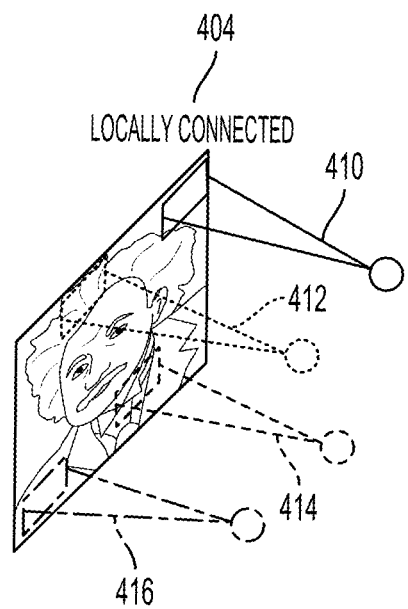

The connections between layers of a neural network may be fully connected or locally connected. FIG. 4A illustrates an example of a fully connected neural network 402. In a fully connected neural network 402, a neuron in a first layer may communicate its output to every neuron in a second layer, so that each neuron in the second layer will receive input from every neuron in the first layer. FIG. 4B illustrates an example of a locally connected neural network 404. In a locally connected neural network 404, a neuron in a first layer may be connected to a limited number of neurons in the second layer. More generally, a locally connected layer of the locally connected neural network 404 may be configured so that each neuron in a layer will have the same or a similar connectivity pattern, but with connections strengths that may have different values (e.g., 410, 412, 414, and 416). The locally connected connectivity pattern may give rise to spatially distinct receptive fields in a higher layer, because the higher layer neurons in a given region may receive inputs that are tuned through training to the properties of a restricted portion of the total input to the network.

Figure 4C:
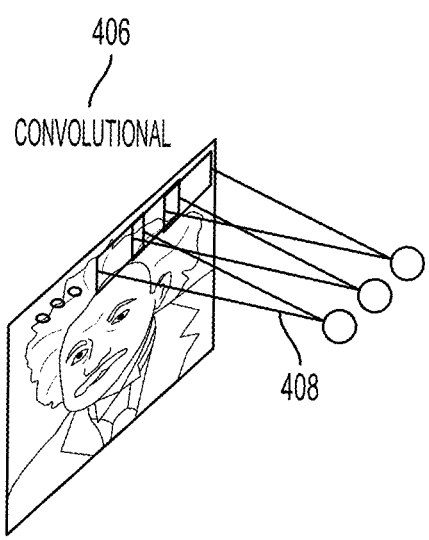

One example of a locally connected neural network is a convolutional neural network. FIG. 4C illustrates an example of a convolutional neural network 406. The convolutional neural network 406 may be configured such that the connection strengths associated with the inputs for each neuron in the second layer are shared (e.g., 408). Convolutional neural networks may be well suited to problems in which the spatial location of inputs is meaningful.

Figure 4D:
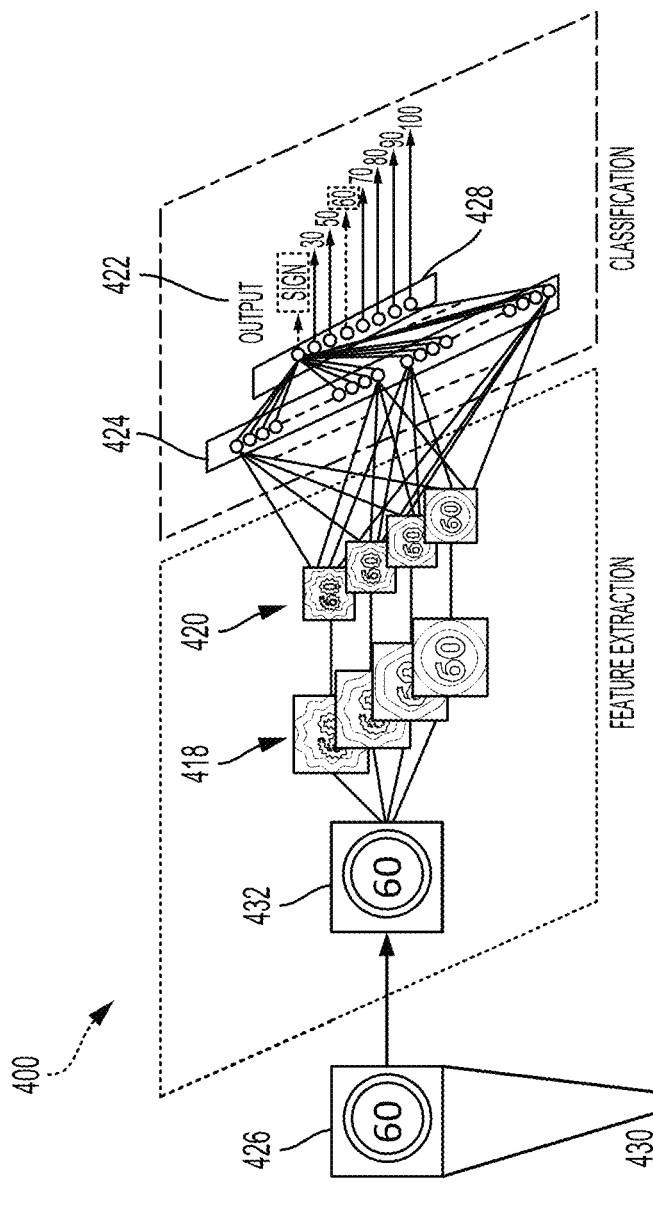
FIG. 4D is a diagram illustrating an exemplary deep convolutional network (DCN) in accordance with aspects of the present disclosure.

One type of convolutional neural network is a deep convolutional network (DCN). FIG. 4D illustrates a detailed example of a DCN 400 designed to recognize visual features from an image 426 input from an image capturing device 430, such as a car-mounted camera. The DCN 400 of the current example may be trained to identify traffic signs and a number provided on the traffic sign. Of course, the DCN 400 may be trained for other tasks, such as identifying lane markings or identifying traffic lights.

The DCN 400 may be trained with supervised learning. During training, the DCN 400 may be presented with an image, such as the image 426 of a speed limit sign, and a forward pass may then be computed to produce an output 422. The DCN 400 may include a feature extraction section and a classification section. Upon receiving the image 426, a convolutional layer 432 may apply convolutional kernels (not shown) to the image 426 to generate a first set of feature maps 418. As an example, the convolutional kernel for the convolutional layer 432 may be a 5×5 kernel that generates 28×28 feature maps. In the present example, because four different feature maps are generated in the first set of feature maps 418, four different convolutional kernels were applied to the image 426 at the convolutional layer 432. The convolutional kernels may also be referred to as filters or convolutional filters.

The first set of feature maps 418 may be subsampled by a max pooling layer (not shown) to generate a second set of feature maps 420. The max pooling layer reduces the size of the first set of feature maps 418. That is, a size of the second set of feature maps 420, such as 14×14, is less than the size of the first set of feature maps 418, such as 28×28. The reduced size provides similar information to a subsequent layer while reducing memory consumption. The second set of feature maps 420 may be further convolved via one or more subsequent convolutional layers (not shown) to generate one or more subsequent sets of feature maps (not shown).

In the example of FIG. 4D, the second set of feature maps 420 is convolved to generate a first feature vector 424. Furthermore, the first feature vector 424 is further convolved to generate a second feature vector 428. Each feature of the second feature vector 428 may include a number that corresponds to a possible feature of the image 426, such as "sign," "60," and "100." A softmax function (not shown) may convert the numbers in the second feature vector 428 to a probability. As such, an output 422 of the DCN 400 is a probability of the image 426 including one or more features.

In the present example, the probabilities in the output 422 for "sign" and "60" are higher than the probabilities of the others of the output 422, such as "30," "40," "50," "70," "80," "90," and "100". Before training, the output 422 produced by the DCN 400 is likely to be incorrect. Thus, an error may be calculated between the output 422 and a target output. The target output is the ground truth of the image 426 (e.g., "sign" and "60"). The weights of the DCN 400 may then be adjusted so the output 422 of the DCN 400 is more closely aligned with the target output.

To adjust the weights, a learning algorithm may compute a gradient vector for the weights. The gradient may indicate an amount that an error would increase or decrease if the weight were adjusted. At the top layer, the gradient may correspond directly to the value of a weight connecting an activated neuron in the penultimate layer and a neuron in the output layer. In lower layers, the gradient may depend on the value of the weights and on the computed error gradients of the higher layers. The weights may then be adjusted to reduce the error. This manner of adjusting the weights may be referred to as "back propagation" as it involves a "backward pass" through the neural network.

In practice, the error gradient of weights may be calculated over a small number of examples, so that the calculated gradient approximates the true error gradient. This approximation method may be referred to as stochastic gradient descent. Stochastic gradient descent may be repeated until the achievable error rate of the entire system has stopped decreasing or until the error rate has reached a target level. After learning, the DCN may be presented with new images (e.g., the speed limit sign of the image 426) and a forward pass through the network may yield an output 422 that may be considered an inference or a prediction of the DCN.

Deep belief networks (DBNs) are probabilistic models comprising multiple layers of hidden nodes. DBNs may be used to extract a hierarchical representation of training data sets. A DBN may be obtained by stacking up layers of Restricted Boltzmann Machines (RBMs). An RBM is a type of artificial neural network that can learn a probability distribution over a set of inputs. Because RBMs can learn a probability distribution in the absence of information about the class to which each input should be categorized, RBMs are often used in unsupervised learning. Using a hybrid unsupervised and supervised paradigm, the bottom RBMs of a DBN may be trained in an unsupervised manner and may serve as feature extractors, and the top RBM may be trained in a supervised manner (on a joint distribution of inputs from the previous layer and target classes) and may serve as a classifier.

Deep convolutional networks (DCNs) are networks of convolutional networks, configured with additional pooling and normalization layers. DCNs have achieved state-of-the-art performance on many tasks. DCNs can be trained using supervised learning in which both the input and output targets are known for many exemplars and are used to modify the weights of the network by use of gradient descent methods.

DCNs may be feed-forward networks. In addition, as described above, the connections from a neuron in a first layer of a DCN to a group of neurons in the next higher layer are shared across the neurons in the first layer. The feed-forward and shared connections of DCNs may be exploited for fast processing. The computational burden of a DCN may be much less, for example, than that of a similarly sized neural network that comprises recurrent or feedback connections.

The processing of each layer of a convolutional network may be considered a spatially invariant template or basis projection. If the input is first decomposed into multiple channels, such as the red, green, and blue channels of a color image, then the convolutional network trained on that input may be considered three-dimensional, with two spatial dimensions along the axes of the image and a third dimension capturing color information. The outputs of the convolutional connections may be considered to form a feature map in the subsequent layer, with each element of the feature map (e.g., 220) receiving input from a range of neurons in the previous layer (e.g., feature maps 218) and from each of the multiple channels. The values in the feature map may be further processed with a non-linearity, such as a rectification, max (0, x). Values from adjacent neurons may be further pooled, which corresponds to down sampling, and may provide additional local invariance and dimensionality reduction. Normalization, which corresponds to whitening, may also be applied through lateral inhibition between neurons in the feature map.

The performance of deep learning architectures may increase as more labeled data points become available or as computational power increases. Modern deep neural networks are routinely trained with computing resources that are thousands of times greater than what was available to a typical researcher just fifteen years ago. New architectures and training paradigms may further boost the performance of deep learning. Rectified linear units may reduce a training issue known as vanishing gradients. New training techniques may reduce over-fitting and thus enable larger models to achieve better generalization. Encapsulation techniques may abstract data in a given receptive field and further boost overall performance.

Figure 5:
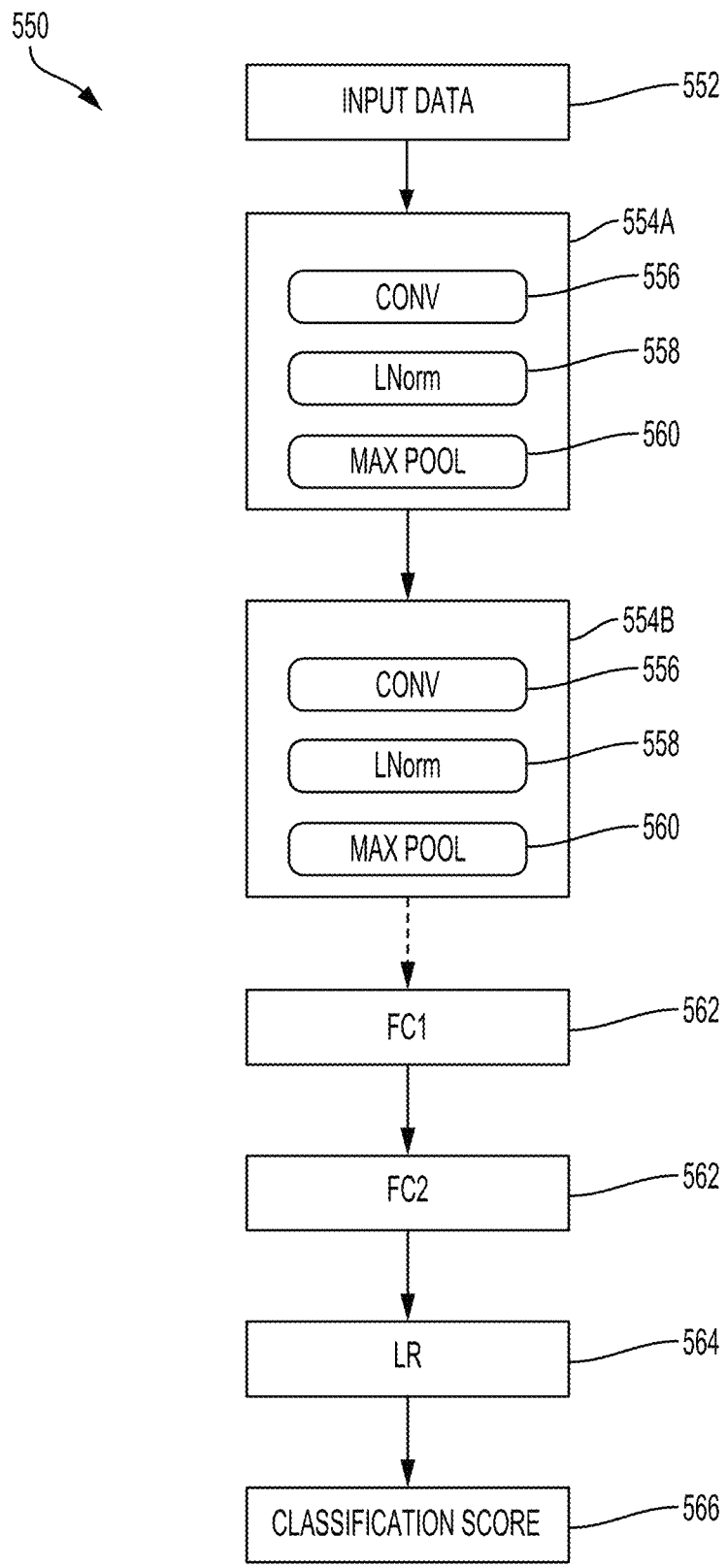
FIG. 5 is a block diagram illustrating an exemplary deep convolutional network (DCN) in accordance with aspects of the present disclosure.

FIG. 5 is a block diagram illustrating a deep convolutional network 550. The deep convolutional network 550 may include multiple different types of layers based on connectivity and weight sharing. As shown in FIG. 5, the deep convolutional network 550 includes the convolution blocks 554A, 554B. Each of the convolution blocks 554A, 554B may be configured with a convolution layer (CONV) 356, a normalization layer (LNorm) 558, and a max pooling layer (MAX POOL) 560.

The convolution layers 556 may include one or more convolutional filters, which may be applied to the input data to generate a feature map. Although only two of the convolution blocks 554A, 554B are shown, the present disclosure is not so limiting, and instead, any number of the convolution blocks 554A, 554B may be included in the deep convolutional network 550 according to design preference. The normalization layer 558 may normalize the output of the convolution filters. For example, the normalization layer 558 may provide whitening or lateral inhibition. The max pooling layer 560 may provide down sampling aggregation over space for local invariance and dimensionality reduction.

The parallel filter banks, for example, of a deep convolutional network may be loaded on a CPU 302 or GPU 304 of an SOC 300 to achieve high performance and low power consumption. In alternative embodiments, the parallel filter banks may be loaded on the DSP 306 or an ISP 316 of an SOC 300. In addition, the deep convolutional network 550 may access other processing blocks that may be present on the SOC 300, such as sensor processor 314 and navigation module 320, dedicated, respectively, to sensors and navigation.

The deep convolutional network 550 may also include one or more fully connected layers 562 (FC1 and FC2). The deep convolutional network 550 may further include a logistic regression (LR) layer 564. Between each layer 556, 558, 560, 562, 564 of the deep convolutional network 550 are weights (not shown) that are to be updated. The output of each of the layers (e.g., 556, 558, 560, 562, 564) may serve as an input of a succeeding one of the layers (e.g., 556, 558, 560, 562, 564) in the deep convolutional network 550 to learn hierarchical feature representations from input data 552 (e.g., images, audio, video, sensor data and/or other input data) supplied at the first of the convolution blocks 554A. The output of the deep convolutional network 550 is a classification score 566 for the input data 552. The classification score 566 may be a set of probabilities, where each probability is the probability of the input data, including a feature from a set of features.

As indicated above, FIGS. 3-5 are provided as examples. Other examples may differ from what is described with respect to FIGS. 3-5.

Artificial intelligence (AI)/machine learning (ML) algorithms can improve wireless communications. An AI/ML module can run at the UE, the base station, or in the case of distributed algorithms, jointly across the UE and base station. In an auto-encoder scenario, joint training occurs across the UE and the base station.

By jointly designing neural networks at the transmitter and the receiver, non-linearities at the transmitter (e.g., from the power amplifier (PA)) can be mitigated while utilizing the available transmit power efficiently. Prior art systems back off power at the transmitter to address non-linearities, which decreases power efficiency because full power is not used.

According to the present disclosure, the encoder network resides at the transmitter (e.g., user equipment (UE)) and the decoder network resides at the receiver (e.g., gNB). The decoder, at the receiver, recovers the encoder input.

According to an aspect of the present disclosure, a first solution employs a neural network to transform a transmit waveform in order to ensure the power amplifier (PA) operates in a linear region. In other words, an encoder neural network and decoder neural network are designed such that the waveform causes the PA to operate in the linear region. The processing of the encoding neural network clips the waveform in the transmitter chain to ensure the amplitude of the waveform does not exceed a threshold value. The encoder therefore anticipates the non-linearity in the PA so the decoder can recover accordingly.

Because the PA non-linearity is avoided, the training of both the encoder and decoder can occur at either the transmitter or the receiver. The two approaches are described below. In both approaches, there is no need to account for the PA non-linearity in the training. That is, non-linearities do not have to be modeled.

The first approach is transmitter (e.g., UE) driven. In this approach, the transmitter finds/generates the encoder and the decoder. The transmitter conveys the decoder information to the receiver. Synthetic data for the channel is used in the training because no real channel is present from the encoder's perspective. A multipath propagation channel model is employed for the training of the neural network. In this case, the channel model is of a linear channel.

The second approach is receiver (e.g., gNB) driven. In the second approach, the receiver finds/generates the encoder and the decoder, and signals the encoder to the transmitter. The actual propagation channel can be observed, measured and used for the training, rather than the synthetic channel data. Alternatively, synthetic channel data can be used.

There are two options for the encoder/decoder locations. In the first option, the processing occurs in the time domain. Thus, the encoder is placed after inverse fast Fourier transform (IFFT), which converts from frequency domain to time domain. The decoder is placed before fast Fourier transform (FFT), which converts from time domain to frequency domain.

In the second option, the processing occurs in the frequency domain. Thus, the encoder is placed before IFFT processing and the decoder is placed after FFT processing.

Figure 6:
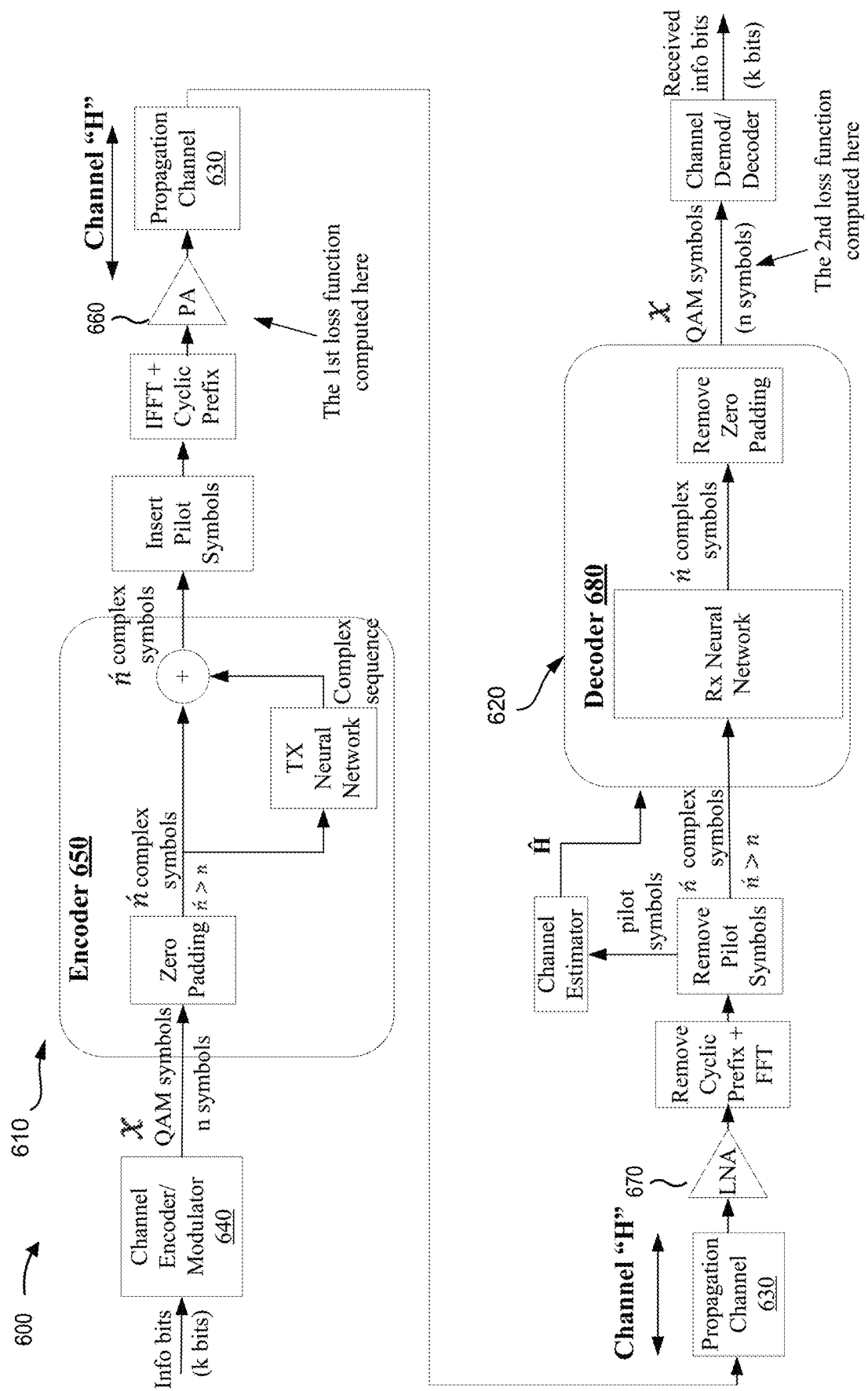
FIG. 6 is a block diagram of an exemplary architecture to implement a first solution for transforming a transmit waveform, in accordance with aspects of the present disclosure.

FIG. 6 is a block diagram of an exemplary architecture 600 to implement this first solution, in accordance with aspects of the present disclosure. The architecture 600 includes an encoder neural network within a transmitter 610 and a decoder neural network within a receiver 620. The transmitter 610 communicates across a propagation channel 630 to the receiver 620. In the example of FIG. 6, there is no MIMO pre-coding of the transmit waveform.

Information bits that will be transmitted to the receiver 620 are input to a channel encoder/modulator 640, which can be the same as the modulator 232, 254 of FIG. 2. The information bits can be any number of bits, represented as k bits. The channel encoder/modulator 640 performs channel encoding, such as generating low density parity check (LDPC) codes, turbo codes, etc. The encoded bits X are mapped to the n modulation symbols, such as quadrature phase shift keying (QPSK) or 16 quadrature amplitude modulation (QAM) symbols. In the present example, QAM symbols will be assumed, although the present disclosure is not so limited.

The n QAM symbols X are zero padded by an encoder 650. In other words, zero value symbols are added to the end of the QAM symbols X. An encoder neural network (Tx neural network) generates a complex sequence, which is added to the zero padded QAM symbols X to create a new waveform. The output of the encoder 650 is the new waveform, which includes n' complex symbols, where n'>n.

The new waveform output from the encoder 650 is mapped to tones of an OFDM symbol, along with inserted pilot tones. The pilot tones are subcarriers containing known tones to help the receiver 620 estimate a channel H. Inverse fast Fourier transformation (IFFT) converts the frequency domain signal into a time domain signal, before adding cyclic prefix and inputting the signal to a power amplifier 660.

For purposes of training the neural networks, a first loss function is measured here, before being input to the power amplifier 660. The first loss function penalizes the peak to average power ratio (PAPR) measured at the output of the transmitter 610. That is, the PAPR is as small as possible to ensure the power amplifier 660 does not operate in the non-linear region based on the output of the IFFT. Due to the modification of the waveform by the encoder neural network, the output of the IFFT block will not cause the power amplifier 660 to enter the non-linear region.

The output of the power amplifier 660 crosses the channel H and is received and amplified by a low noise amplifier (LNA) 670 of the receiver 620. The cyclic prefix is removed and a fast Fourier transform (FFT) recovers the frequency domain symbols. Pilot symbols are removed and a channel estimator estimates the channel H based on the pilot symbols. The channel estimate H and the n' complex symbols are fed to a decoder 680. The decoder neural network (Rx neural network) recovers the n' complex symbols. Subsequently, zero padding is removed and the original QAM symbols X are recovered.

After the QAM symbols X are recovered, a second loss function is computed when training the neural networks. That is, the second loss function attempts to minimize the mean squared error between the recovered modulation symbols and the modulation symbols input to the encoder 650.

The total loss function for the training of the neural networks can be the sum of a weighted first loss function and a weighted second loss function. By training the neural networks with the total loss function, the overall design of the encoder neural network and decoder neural network ensures the power amplifier 660 operates in the linear region.

According to another aspect of the present disclosure, a second solution includes a neural network transforming the transmit waveform to ensure the power amplifier (PA) operates near the saturation region. That is, the PA will non-linearly distort the waveform. Thus, the encoder and decoder are designed such that the PA operates near the saturation region. The structure of the neural network for the first solution and the second solution can be the same. The weights within the neural network and the loss function, however, would be different for the different solutions.

The encoder and decoder should understand what is between them: in this case PA non-linearity in addition to the propagation channel. In order to train the encoder/decoder, a PA non-linearity model (non-linearity information) is generated. In other words, a neural network modeling the PA non-linearity is derived. Two approaches for the neural network are considered.

The first approach is transmitter (e.g., UE) driven. In this approach, the transmitter finds/generates the neural network that models the PA non-linearity. The transmitter trains the encoder and the decoder, and signals the decoder to the receiver. Synthetic data for the channel is used in the training.

The second approach is receiver (e.g., gNB) driven. In the second approach, the transmitter finds/generates the neural network that models the PA non-linearity. Because the receiver is unaware of any non-linearities within the transmitter, the transmitter generates the non-linearity model and signals the neural network to the receiver. After receiving the PA non-linearity information, the receiver trains the encoder and the decoder, and signals the encoder to the transmitter. In this approach, the actual channel can be measured and used in the training, rather than the synthetic channel. Alternatively, the synthetic channel can be used for training.

There are two options for the encoder/decoder locations for this second solution. In the first option, the processing occurs in the time domain. Thus, the encoder is placed after inverse fast Fourier transform (IFFT), which converts from frequency domain to time domain. The decoder is placed before fast Fourier transform (FFT), which converts from time domain to frequency domain.

In the second option, the encoder and decoder operate on the waveform in the frequency domain. Thus, the encoder is placed before IFFT processing and the decoder is placed after FFT processing.

Multiple input multiple output (MIMO) processing can also be incorporated into both the first and second solutions. To address MIMO, the pre-coding block location with respect to the encoder in the transmitter can be either after the encoder or before the encoder. Pilot insertion options are available for the first and second solutions. Also, the pilot insertion can occur either before or after the encoder neural network.

When the pre-coding block location is after the encoder, the pre-coded channel is used as side information at the decoder. The pre-coded channel is a cascade of the raw propagation channel and the pre-coder coefficients applied at the transmitter. Side information is information input to the decoder to enable the decoder to recover the input to the encoder, for example channel information in the first two solutions discussed previously.

When the pre-coding block is placed before the encoder, the encoder input symbols are not quadrature amplitude modulation (QAM) symbols due to pre-coding. Either an estimate of the raw propagation channel or the pre-coded channel is used as side information at the decoder. The reconstruction target may be the QAM symbols from the output of the channel encoder/modulator or the pre-coded symbols. The target is the QAM symbols when the side information is the pre-coded channel. The target is the complex symbols when the side information is the estimated propagation channel.

Figure 7:
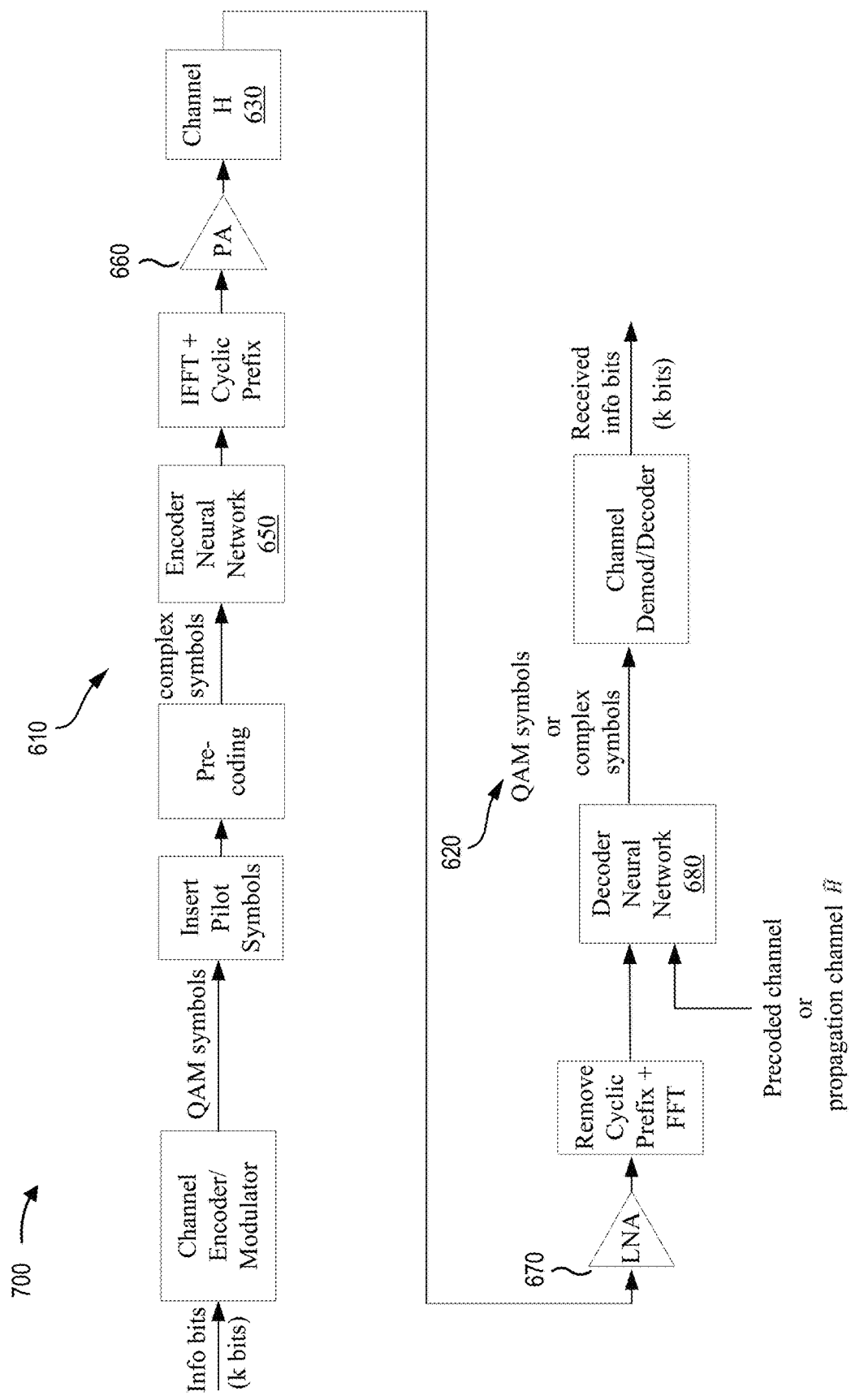
FIGS. 7-11 are block diagrams of exemplary architectures to transform a transmit waveform, in accordance with aspects of the present disclosure.

FIG. 7 is a block diagram of an exemplary architecture 700 to transform a transmit waveform, in accordance with aspects of the present disclosure. In this architecture 700, the pre-coding occurs before the encoder 650, and the pilot symbols are also inserted before the encoder 650. Although inserting of zero padding is not shown in this figure, it can optionally be included. Similar to as described with respect to FIG. 6, information bits are encoded and modulated. Pilot symbols are inserted with these modulated QAM symbols and then pre-coding occurs. The pilot symbols are inserted in the frequency domain. After pre-coding, the complex symbols are no longer QAM symbols due to the pre-coding transformation.

Cyclic prefix and IFFT processing occur, as described with respect to FIG. 6. At the receiver 620, the signal is processed by the LNA 670, and then further processed to remove the cyclic prefix and return the signal to the frequency domain.

The decoder 680 receives the frequency domain symbols. The decoder 680 also receives side information including either the pre-coded channel or the raw propagation channel $\hat{H}$, estimated from the transmitted pilot tones. The reconstruction target output from the decoder 680 is either the QAM symbols or the complex symbols obtained by applying the pre-coding to the QAM symbols. The target is the QAM symbols when the side information is the pre-coded channel. The target is the complex symbols when the side information is the estimated propagation channel $\hat{H}$.

Figure 8:
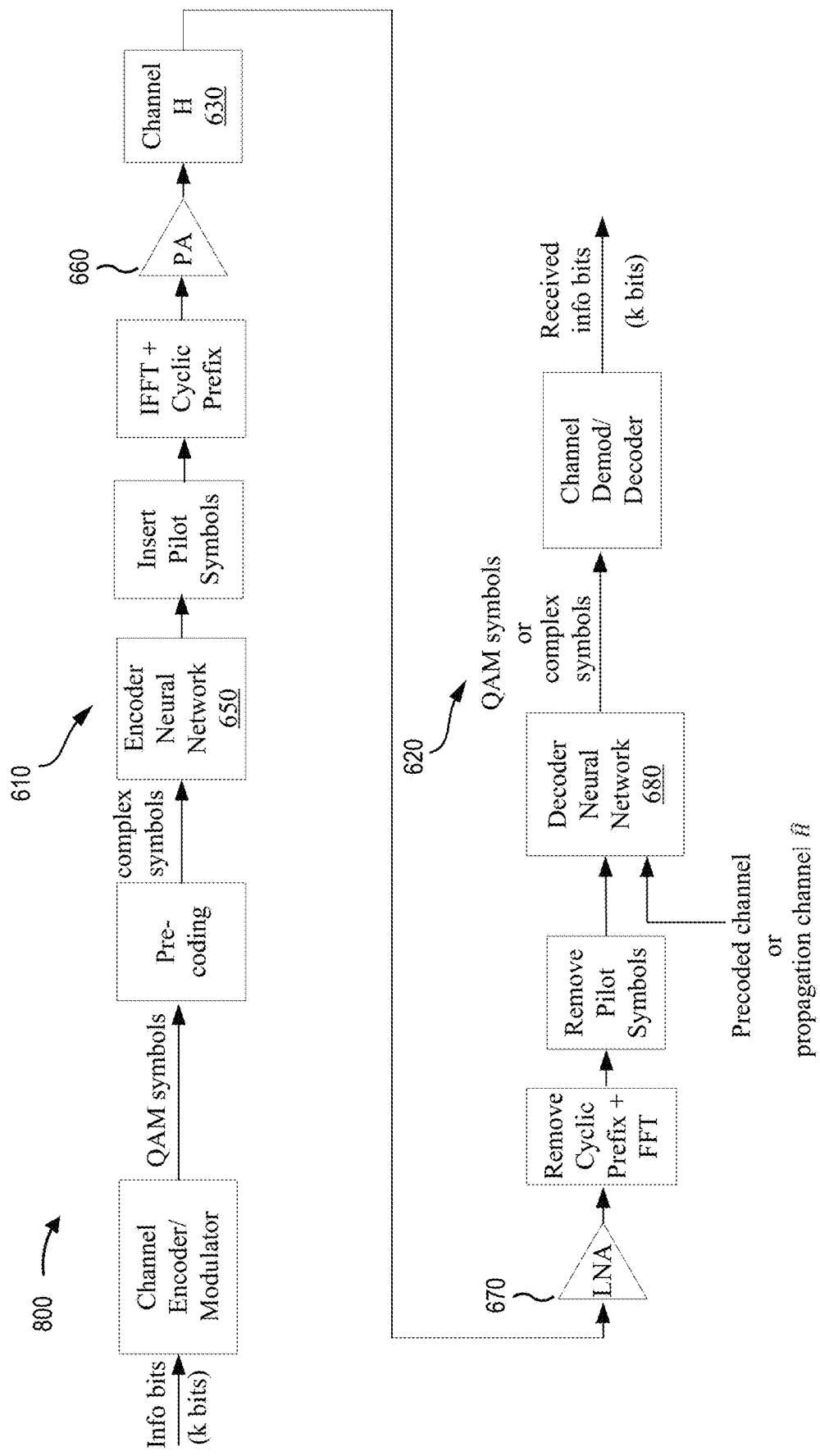

FIG. 8 is a block diagram of another exemplary architecture 800 to transform a transmit waveform, in accordance with aspects of the present disclosure. In this architecture 800, the pre-coding occurs before the encoder 650, and the pilot symbols are inserted after the encoder 650.

Similar to as described with respect to FIG. 6, information bits are encoded and modulated. Pre-coding of the modulated symbols occurs so the complex symbols are no longer QAM symbols due to the pre-coding transformation. After processing by the encoder 650, the pilot symbols are inserted. Cyclic prefix and IFFT processing then occur, as described with respect to FIG. 6. Although inserting of zero padding is not shown in this figure, it can optionally be included.

At the receiver 620, the signal is processed by the LNA 670, and then further processed to remove the cyclic prefix and return the signal to the frequency domain. Next, the pilot signals are removed. The decoder 680 receives the frequency domain symbols after removal of the pilot symbols. The decoder 680 also receives side information including either the pre-coded channel (e.g., the cascade of the pre-coding and the raw channel estimated from the pilot symbols) or the estimated raw propagation channel $\hat{H}$, estimated from the transmitted pilot tones.

The reconstruction target output from the decoder 680 is either the QAM symbols or the complex symbols obtained by applying the pre-coding to the QAM symbols. The target is the QAM symbols when the side information is the pre-coded channel. The target is the complex symbols when the side information is the propagation channel $\hat{H}$.

Figure 9:
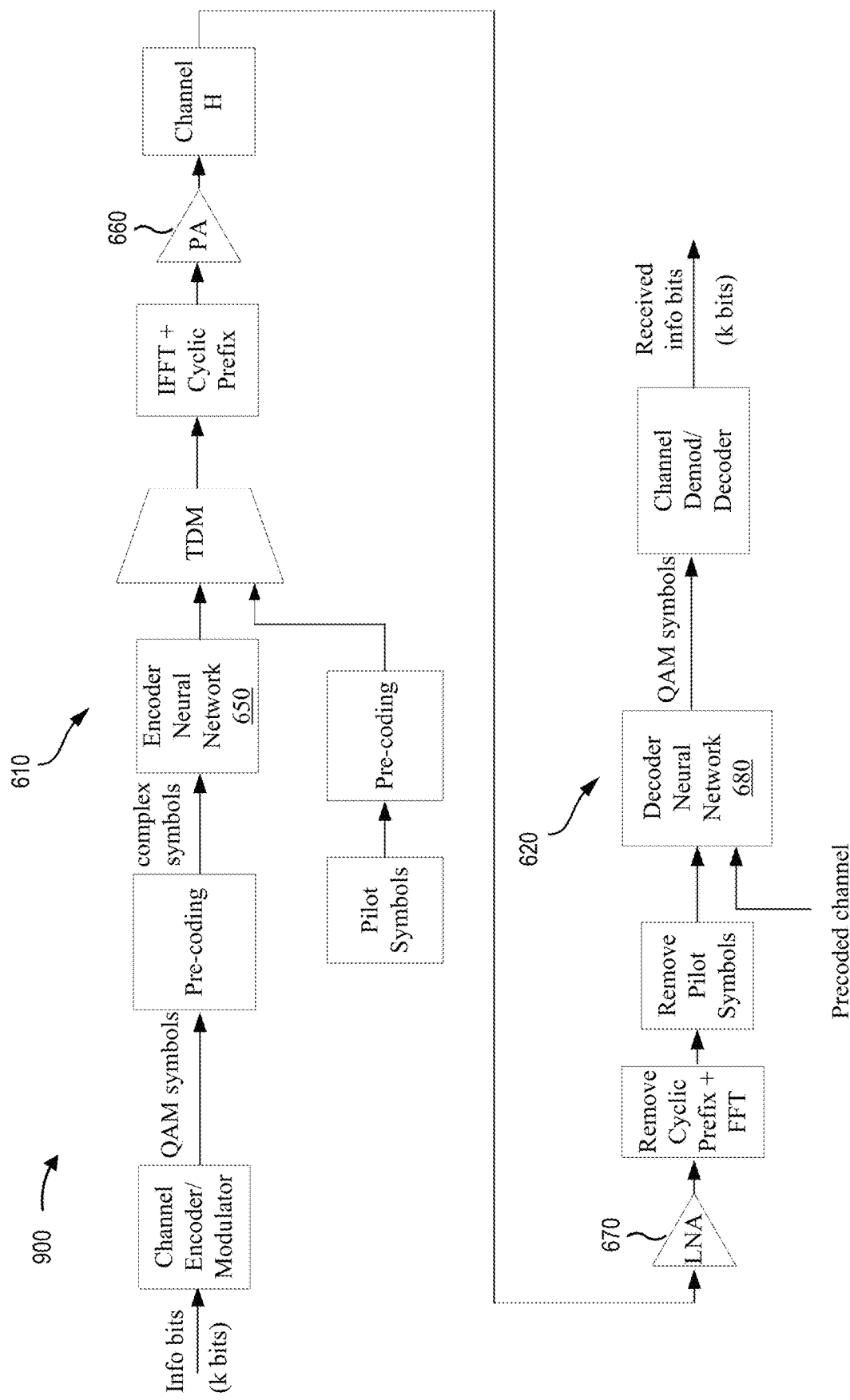

FIG. 9 is a block diagram of yet another exemplary architecture 900 to transform a transmit waveform, in accordance with aspects of the present disclosure. In this architecture 900, the pre-coding occurs before the encoder 650, and the pilot symbols are inserted after the encoder 650.

Similar to as described with respect to FIG. 6, information bits are encoded and modulated. Pre-coding of the modulated symbols occurs so the complex symbols are no longer QAM symbols.

The pilot symbols are pre-coded and time-division multiplexed (TDM) with the output of the encoder 650. That is, the pilot symbols are sent at different times than the data symbols. The pilot symbols are pre-coded in the same manner as the data symbols. Moreover, the pilot symbols are generated from a low peak to average power ratio (PAPR) sequence. Thus, a channel estimate is not affected by non-linearity.

Cyclic prefix and IFFT processing then occur, as described with respect to FIG. 6. Although inserting of zero padding is not shown in this figure, it can optionally be included.

At the receiver 620, the signal is processed by the LNA 670, and then further processed to remove the cyclic prefix and return the signal to the frequency domain. Next, the pilot signals are removed.

The decoder 680 receives the frequency domain data tones after removal of the pilot symbols. The decoder 680 also receives side information including the pre-coded channel coefficients. The reconstruction target output from the decoder 680 is either the QAM symbols from the output of the channel encoder/modulator or a linear combination of the QAM symbols by the pre-coded channel coefficients, which is the traditional information used by the receiver chain.

Figure 10:
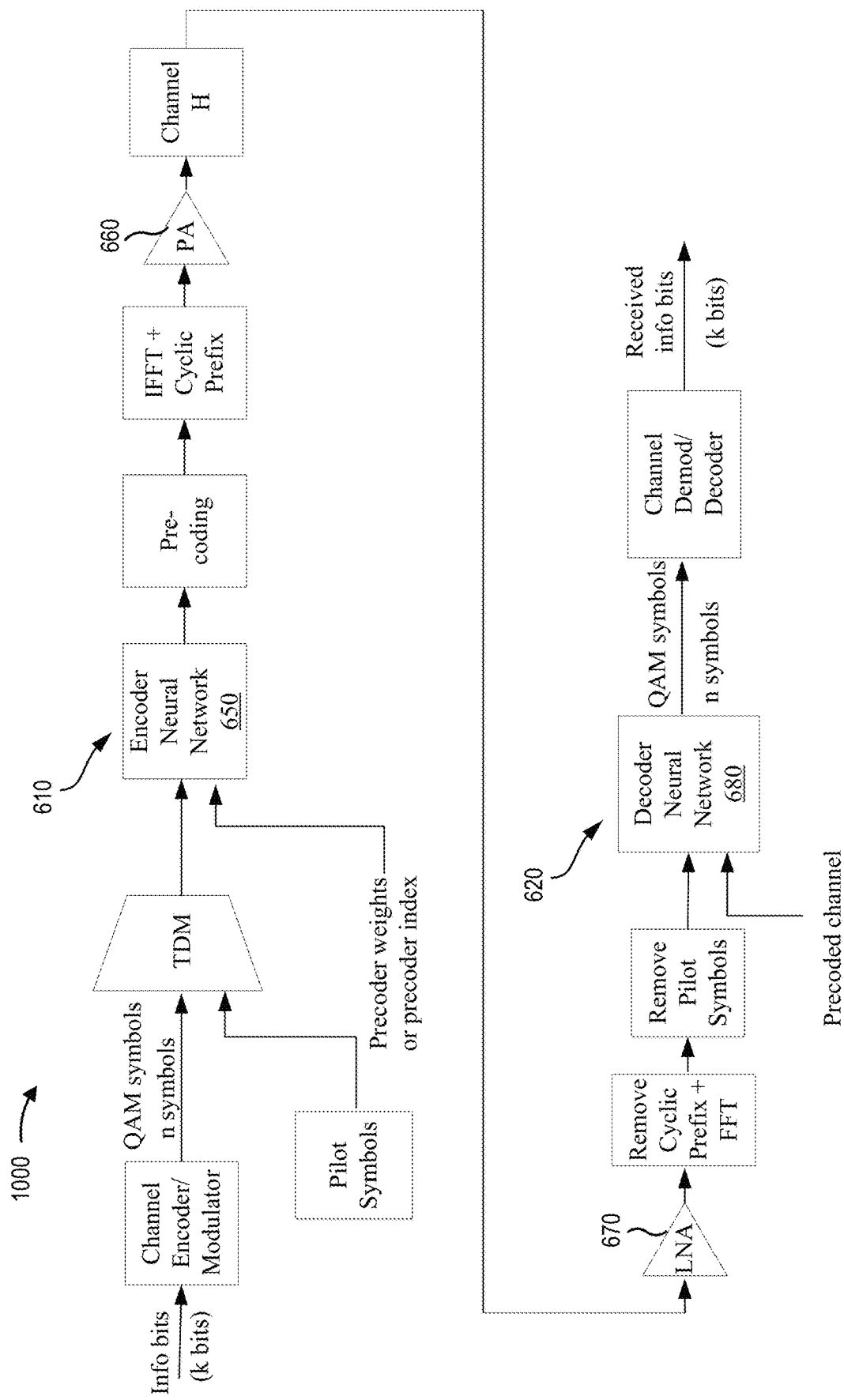

FIG. 10 is a block diagram of yet another exemplary architecture 1000 to transform a transmit waveform, in accordance with aspects of the present disclosure. In this architecture 1000, the pre-coding occurs after the encoder 650, and the pilot symbols are inserted before the encoder 650.

Similar to as described with respect to FIG. 6, information bits are encoded and modulated into QAM symbols (data symbols). The pilot symbols are time-division multiplexed with the QAM symbols.

Pre-coder weights or a pre-coder index is input as side information to the neural network of the encoder 650. Thus, the encoding neural network encodes based on the pre-coding that will occur at the output of the encoder 650.

Cyclic prefix and IFFT processing then occur, as described with respect to FIG. 6. Although inserting of zero padding is not shown in this figure, it can optionally be included.

At the receiver 620, the signal is processed by the LNA 670, and then further processed to remove the cyclic prefix and return the signal to the frequency domain. Next, the pilot signals are removed.

The decoder 680 receives the frequency domain data tones after removal of the pilot symbols. The pre-coded channel coefficients (e.g., the cascade of the pre-coding and the raw channel estimated from the pilot symbols) are input to the decoder 680 as side information. The reconstruction target output from the decoder 680 is the QAM symbols from the output of the channel encoder/modulator.

Figure 11:
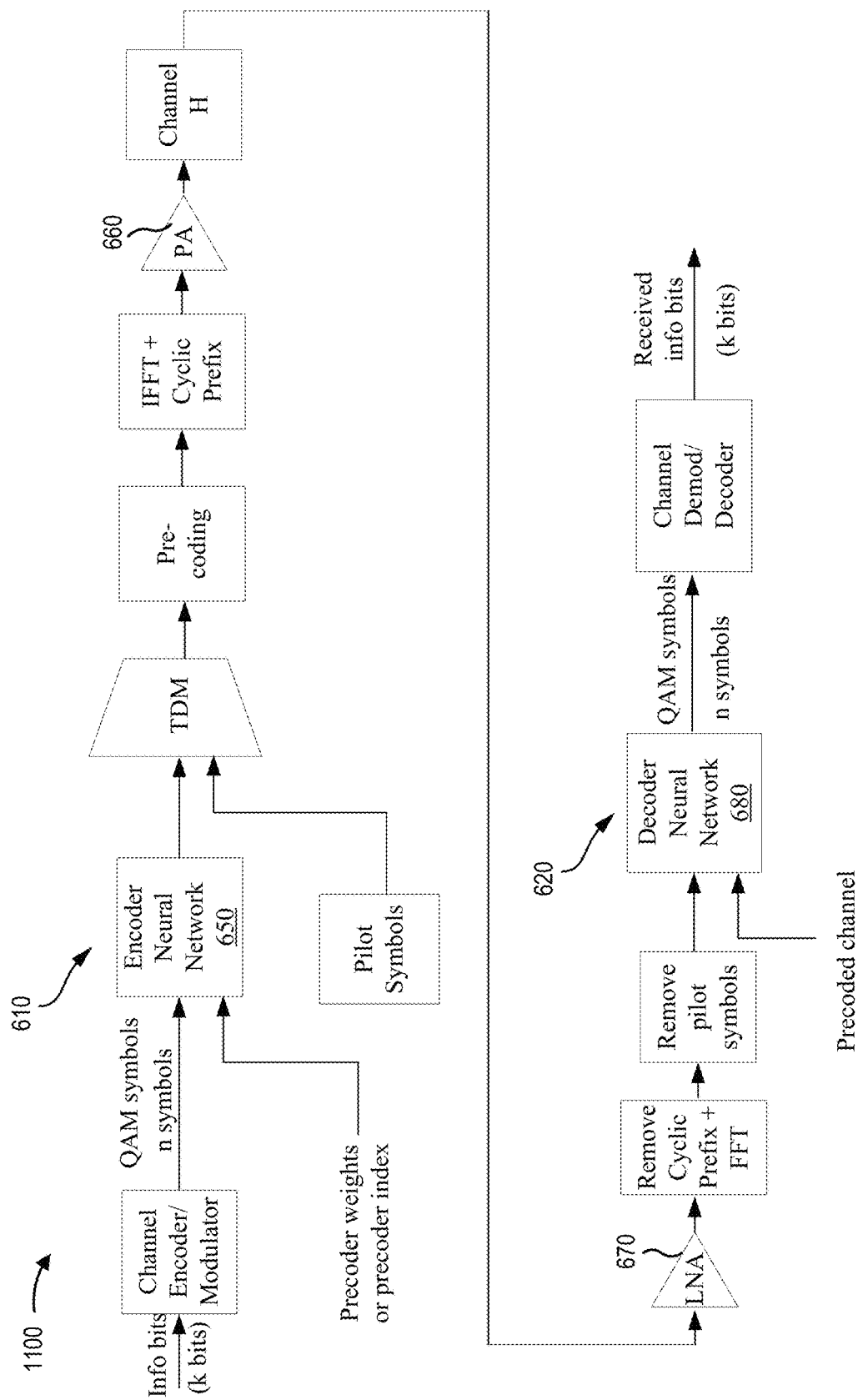

FIG. 11 is a block diagram of a further exemplary architecture 1100 to transform a transmit waveform, in accordance with aspects of the present disclosure. In this architecture 1100, the pre-coding occurs after the encoder 650, and the pilot symbols are inserted after the encoder 650.

Similar to as described with respect to FIG. 6, information bits are encoded and modulated and input to the encoder 650. Because pre-coding follows the neural network processing of the encoder 650, pre-coder weights or a pre-coder index is input as side information to the neural network of the encoder 650. Thus, the encoding neural network encodes based on the pre-coding that will occur at the output of the encoder 650.

The pilot symbols are time-division multiplexed with the data symbols output from the channel encoder/modulator. The pilot tones are generated from a low peak to average power ratio (PAPR) sequence to isolate the channel estimate from PA non-linearity.

Cyclic prefix and IFFT processing then occur, as described with respect to FIG. 6. Although inserting of zero padding is not shown in this figure, it can optionally be included.

At the receiver 620, the signal is processed by the LNA 670, and then further processed to remove the cyclic prefix and return the signal to the frequency domain. Next, the pilot symbols are removed.

The decoder 680 receives the frequency domain data tones after removal of the pilot symbols. The decoder 680 also receives side information including the pre-coded channel coefficients. The reconstruction target output from the decoder 680 is either the QAM symbols from the output of the channel encoder/modulator or a linear combination of the QAM symbols by the pre-coded channel coefficients.

According to another aspect of the present disclosure, distortion feedback can be used to address the PA non-linearity. In this solution, the transmitter conveys the distortion error, $\varepsilon = G(x) - x$ to the receiver via compression, where x=the non-distorted digital transmit waveform in time domain (data being transported); and G (x)=the output of clipping and filtering (e.g., non-linearity).

An encoder/decoder of an auto-encoder compresses the distortion error $\varepsilon$, with a compression scheme. The encoder (denoted by the function $f(\bullet)$) at the transmitter encodes the distortion error $\varepsilon$ for compression. The encoder output $f(\varepsilon)$ (e.g., distortion information compressed by the encoder of the auto-encoder) is transmitted to the receiver. The encoder is placed subsequent to the IFFT.

The decoder $g(\bullet, \bullet)$ at the receiver decodes the received compressed distortion error $f(\varepsilon)$ to recover the distortion error $\varepsilon$. The distortion error $\varepsilon$ is used to recover the undistorted signal x. The function g $(f(\varepsilon), H)$=the distortion error $\varepsilon$, where H is the channel and $f(\varepsilon)$ is the encoder output. The decoder is placed before the FFT.

The transmitter trains both the encoder and the decoder, and signals the found/determined decoder to the receiver.

Figure 12:
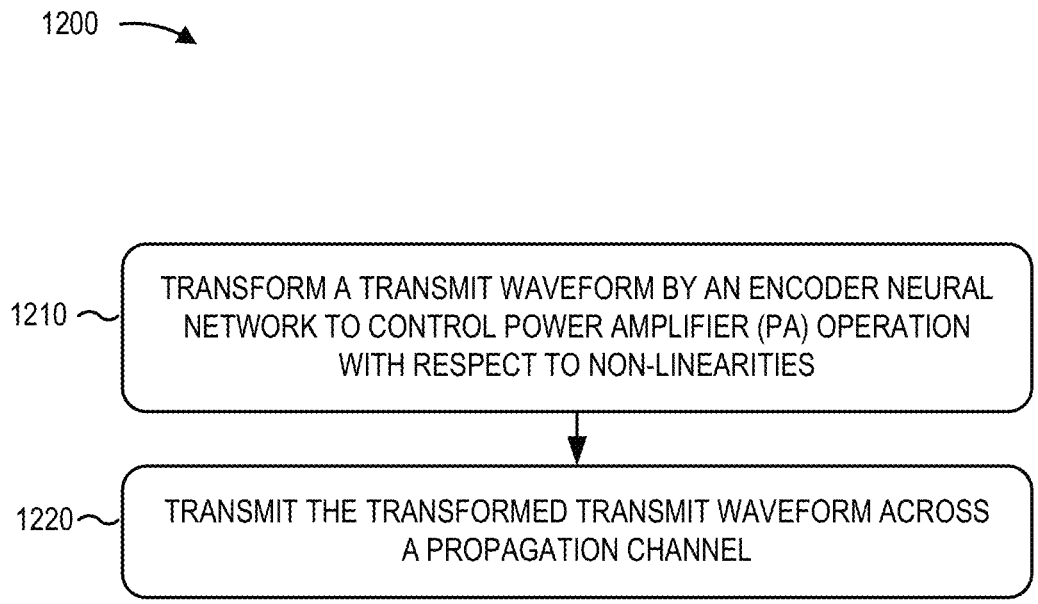
FIG. 12 is a diagram illustrating an example process performed, for example, by a transmitting device, in accordance with various aspects of the present disclosure.

FIG. 12 is a diagram illustrating an example process 1200 performed, for example, by a transmitting device, in accordance with various aspects of the present disclosure. The example process 1200 is an example of machine learning for addressing transmit (TX) non-linearity.

As shown in FIG. 12, in some aspects, the process 1200 may include transforming a transmit waveform by an encoder neural network to control power amplifier (PA) operation with respect to non-linearities (block 1210). For example, the UE (e.g., using the controller/processor 280, memory 282, and or the like) or the base station (e.g., using the controller/processor 240, memory 242, and or the like) can transform a transmit waveform.

As shown in FIG. 12, in some aspects, the process 1200 may include transmitting the transformed transmit waveform across a propagation channel (block 1220). For example, the UE (e.g., using the antenna 252, DEMOD 254, TX MIMO processor 266, transmit processor 264, controller/processor 280, memory 282, and or the like) or the base station (e.g., using the antenna 234, MOD 232, TX MIMO processor 230, transmit processor 220, controller/processor 240, memory 242, and or the like) can transmit the transformed transmit waveform.

Figure 13:
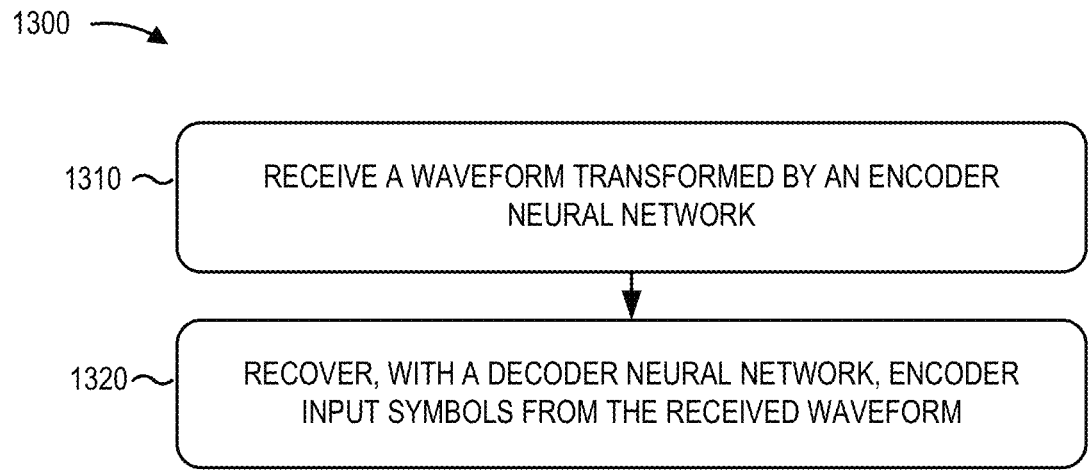
FIG. 13 is a diagram illustrating an example process performed, for example, by a receiving device, in accordance with various aspects of the present disclosure.

FIG. 13 is a diagram illustrating an example process 1300 performed, for example, by a receiving device, in accordance with various aspects of the present disclosure. The example process 1300 is an example of machine learning for addressing transmit (TX) non-linearity.

As shown in FIG. 13, in some aspects, the process 1300 may include receiving a waveform transformed by an encoder neural network (block 1310). For example, the UE (e.g., using the antenna 252, DEMOD 254, MIMO detector 256, receive processor 258, controller/processor 280, memory 282, and or the like) or the base station (e.g., using the antenna 234, MOD 232, MIMO detector 236, receive processor 238, controller/processor 240, memory 242, and or the like) can receive a waveform.

As shown in FIG. 13, in some aspects, the process 1300 may include recovering, with a decoder neural network, encoder input symbols from the received waveform (block 1320). For example, the UE (e.g., using the controller/processor 280, memory 282, and or the like) or the base station (e.g., using the controller/processor 240, memory 242, and or the like) can recover encoder input symbols.

Figure 14:
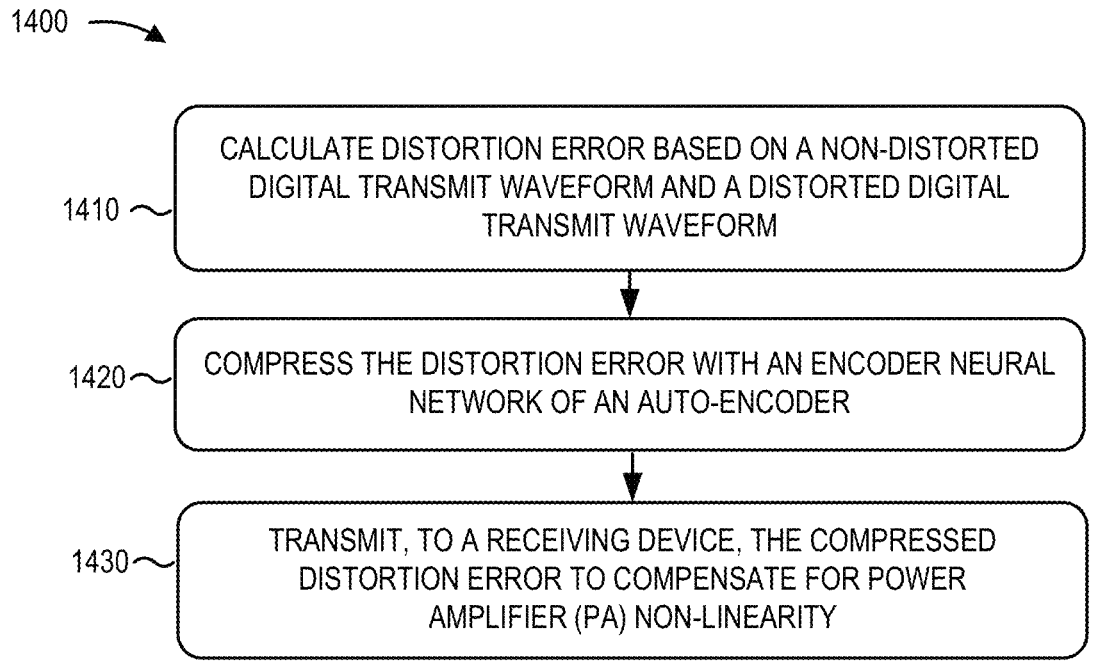
FIG. 14 is a diagram illustrating an example process performed, for example, by a transmitting device, in accordance with various aspects of the present disclosure.

FIG. 14 is a diagram illustrating an example process 1400 performed, for example, by a transmitting device, in accordance with various aspects of the present disclosure. The example process 1400 is an example of machine learning for addressing transmit (TX) non-linearity.

As shown in FIG. 14, in some aspects, the process 1400 may include calculating distortion error based on a non-distorted digital transmit waveform and a distorted digital transmit waveform (block 1410). For example, the UE (e.g., using the controller/processor 280, memory 282, and or the like) or the base station (e.g., using the controller/processor 240, memory 242, and or the like) can calculate distortion error.

As shown in FIG. 14, in some aspects, the process 1400 may include compressing the distortion error with an encoder neural network of an auto-encoder (block 1420). For example, the UE (e.g., using the controller/processor 280, memory 282, and or the like) or the base station (e.g., using the controller/processor 240, memory 242, and or the like) can compress the distortion error.

As shown in FIG. 14, in some aspects, the process 1400 may include transmitting, to a receiving device, the compressed distortion error to compensate for power amplifier (PA) non-linearity (block 1430). For example, the UE (e.g., using the antenna 252, DEMOD 254, TX MIMO processor 266, transmit processor 264, controller/processor 280, memory 282, and or the like) or the base station (e.g., using the antenna 234, MOD 232, TX MIMO processor 230, transmit processor 220, controller/processor 240, memory 242, and or the like) can transmit the compressed distortion error.

Figure 15:
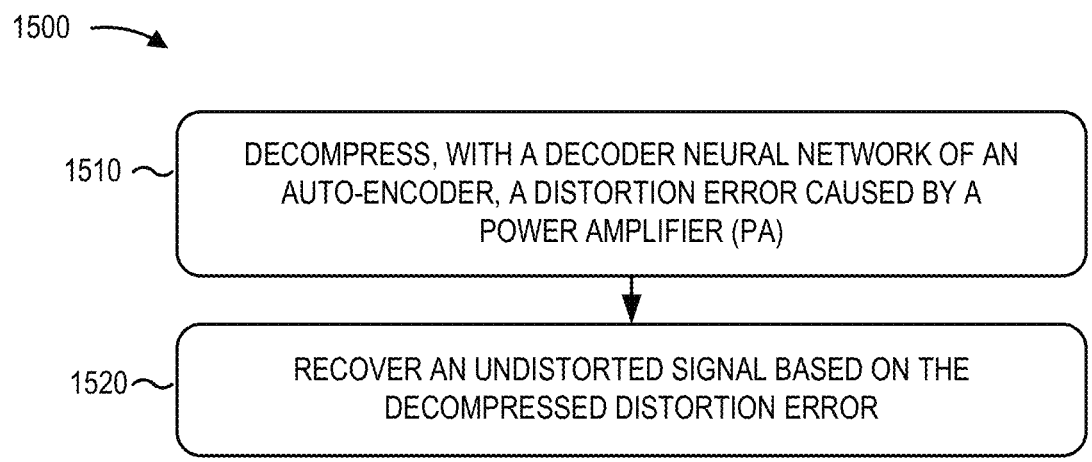
FIG. 15 is a diagram illustrating an example process performed, for example, by a receiving device, in accordance with various aspects of the present disclosure.

FIG. 15 is a diagram illustrating an example process 1500 performed, for example, by a receiving device, in accordance with various aspects of the present disclosure. The example process 1500 is an example of machine learning for addressing transmit (TX) non-linearity.

As shown in FIG. 15, in some aspects, the process 1500 may include decompressing, with a decoder neural network of an auto-encoder, a distortion error caused by a power amplifier (PA) (block 1510). For example, the UE (e.g., using the controller/processor 280, memory 282, and or the like) or the base station (e.g., using the controller/processor 240, memory 242, and or the like) can decompress a distortion error.

As shown in FIG. 15, in some aspects, the process 1500 may include recovering an undistorted signal based on the decompressed distortion error (block 1520). For example, the UE (e.g., using the controller/processor 280, memory 282, and or the like) or the base station (e.g., using the controller/processor 240, memory 242, and or the like) can recover an undistorted signal based.

Although FIGS. 12-15 show example blocks of the processes 1200, 1300, 1400, 1500 in some aspects, the processes 1200, 1300, 1400, 1500 may include additional blocks, fewer blocks, different blocks, or differently arranged blocks than those depicted in FIGS. 12-15. Additionally, or alternatively, two or more of the blocks of the processes 1200, 1300, 1400, 1500 may be performed in parallel.

Implementation examples are described in the following numbered clauses:

1. A method of wireless communications by a transmitting device, comprising:
   transforming a transmit waveform by an encoder neural network to control power amplifier (PA) operation with respect to non-linearities; and
   transmitting the transformed transmit waveform across a propagation channel.
2. The method of clause 1, further comprising transforming the transmit waveform to ensure the PA operates in a linear region.
3. The method of any of the preceding clauses, further comprising transforming the transmit waveform to ensure the PA operates near a saturation region.
4. The method of any of the preceding clauses, further comprising:
   generating the encoder neural network and a decoder neural network; and
   transmitting the decoder neural network to a receiving device.
5. The method of any of the preceding clauses, further comprising training the encoder neural network and the decoder neural network with synthetic channel data.
6. The method of any of the preceding clauses, further comprising encoding by the encoder neural network in a frequency domain or a time domain.
7. The method of any of the preceding clauses, further comprising mapping outputs of the encoder neural network to orthogonal frequency division multiplexed (OFDM) symbols corresponding to input data.
8. The method of any of the preceding clauses, in which a loss function of the encoder neural network is based on a peak to average power ratio (PAPR) of the transmit waveform.
9. The method of any of the preceding clauses, further comprising inserting a pilot signal before or after encoding by the encoder neural network.
10. The method of any of the preceding clauses, in which the pilot signal is pre-coded and inserted after the encoding, the pre-coded pilot signal time-division multiplexed with output from the encoder neural network.
11. The method of any of clauses 1-9, in which the pilot signal is inserted before the encoding, the pilot signal time-division multiplexed with data symbols before encoding by the encoder neural network, the encoder neural network receiving pre-coder weights or a pre-coder index as side information.
12. The method of any of clauses 1-9, in which the pilot signal is inserted after the encoding, the pilot signal time-division multiplexed with output from the encoder neural network, the encoder neural network receiving pre-coder weights or a pre-coder index as side information.
13. A method of wireless communications by a receiving device, comprising:
    receiving a waveform transformed by an encoder neural network; and
    recovering, with a decoder neural network, encoder input symbols from the received waveform.
14. The method of clause 13, further comprising:
    generating the encoder neural network and the decoder neural network; and
    transmitting the encoder neural network to a transmitting device.
15. The method of clauses 13 or 14, further comprising training the encoder neural network and the decoder neural network with synthetic channel data or with actual channel measurements.
16. The method of any of the clauses 13-15, further comprising recovering the encoder input symbols based on side information comprising a pre-coded channel or a raw propagation channel.
17. The method of any of the clauses 13-16, in which a reconstruction target comprises symbols output from a channel encoder/modulator at a transmitting device, pre-coded symbols at the transmitting device, complex symbols obtained by applying pre-coding to the symbols, or a linear combination of symbols output from the channel encoder/modulator by pre-coded channel coefficients.

18. A method of wireless communications, at a transmitting device, comprising:
   calculating distortion error based on a non-distorted digital transmit waveform and a distorted digital transmit waveform;
   compressing the distortion error with an encoder neural network of an auto-encoder; and
   transmitting, to a receiving device, the compressed distortion error to compensate for power amplifier (PA) non-linearity.

19. The method of clause 18, further comprising:
   training the encoder neural network and a decoder neural network; and
   transmitting the decoder neural network to the receiving device.

20. A method of wireless communications, at a receiving device, comprising:
   decompressing, with a decoder neural network of an auto-encoder, a distortion error caused by a power amplifier (PA); and
   recovering an undistorted signal based on the decompressed distortion error.

21. A transmitting device for wireless communication, comprising:
   a memory, and
   at least one processor operatively coupled to the memory, the memory and the at least one processor configured:
      to transform a transmit waveform by an encoder neural network to control power amplifier (PA) operation with respect to non-linearities; and
      to transmit the transformed transmit waveform across a propagation channel.

22. The transmitting device of clause 21, in which the at least one processor is further configured to transform the transmit waveform to ensure the PA operates in a linear region.

23. The transmitting device of clause 21 or 22, in which the at least one processor is further configured to transform the transmit waveform to ensure the PA operates near a saturation region.

24. The transmitting device of any of the clauses 21-23, in which the at least one processor is further configured:
   to generate the encoder neural network and a decoder neural network; and
   to transmit the decoder neural network to a receiving device.

25. The transmitting device of any of the clauses 21-24, in which the at least one processor is further configured to train the encoder neural network and the decoder neural network with synthetic channel data.

26. The transmitting device of any of the clauses 21-25, in which the at least one processor is further configured to encode by the encoder neural network in a frequency domain or a time domain.

27. The transmitting device of any of the clauses 21-26, in which the at least one processor is further configured to map outputs of the encoder neural network to orthogonal frequency division multiplexed (OFDM) symbols corresponding to input data.

28. The transmitting device of any of the clauses 21-27, in which a loss function of the encoder neural network is based on a peak to average power ratio (PAPR) of the transmit waveform.

29. The transmitting device of any of the clauses 21-28, in which the at least one processor is further configured to insert a pilot signal before or after encoding by the encoder neural network.

30. The transmitting device of any of the clauses 21-29, in which the pilot signal is pre-coded and inserted after the encoding, the pre-coded pilot signal time-division multiplexed with output from the encoder neural network.

31. The transmitting device of any of the clauses 21-29, in which the at least one processor is further configured to insert the pilot signal before the encoding, the pilot signal time-division multiplexed with data symbols before encoding by the encoder neural network, the encoder neural network receiving pre-coder weights or a pre-coder index as side information.

32. The transmitting device of any of the clauses 21-29, in which the at least one processor is further configured to insert the pilot signal after the encoding, the pilot signal time-division multiplexed with output from the encoder neural network, the encoder neural network receiving pre-coder weights or a pre-coder index as side information.

33. A receiving device for wireless communication comprising:
   a memory, and
   at least one processor operatively coupled to the memory, the memory and the at least one processor configured:
      to receive a waveform transformed by an encoder neural network; and
      to recover, with a decoder neural network, encoder input symbols from the received waveform.

34. The receiving device of clause 33, in which the at least one processor is further configured:
   to generate the encoder neural network and the decoder neural network; and
   to transmit the encoder neural network to a transmitting device.

35. The receiving device of any of the clauses 33-34, in which the at least one processor is further configured to train the encoder neural network and the decoder neural network with synthetic channel data or with actual channel measurements.

36. The receiving device of any of the clauses 33-35, in which the at least one processor is further configured to recover the encoder input symbols based on side information comprising a pre-coded channel or a raw propagation channel.

37. The receiving device of any of the clauses 33-36, in which a reconstruction target comprises symbols output from a channel encoder/modulator at a transmitting device, pre-coded symbols at the transmitting device, complex symbols obtained by applying pre-coding to the symbols, or a linear combination of symbols output from the channel encoder/modulator by pre-coded channel coefficients.

38. An apparatus comprising at least one means for performing a method of any of clauses 1 to 20.

39. A non-transitory computer-readable medium storing code for wireless communications, the code comprising instructions executable by a processor to perform a method of any of clauses 1 to 20.

The foregoing disclosure provides illustration and description, but is not intended to be exhaustive or to limit the aspects to the precise form disclosed. Modifications and variations may be made in light of the above disclosure or may be acquired from practice of the aspects.

As used herein, the term "component" is intended to be broadly construed as hardware, firmware, and/or a combination of hardware and software. As used herein, a processor is implemented in hardware, firmware, and/or a combination of hardware and software.

Some aspects are described herein in connection with thresholds. As used herein, satisfying a threshold may, depending on the context, refer to a value being greater than the threshold, greater than or equal to the threshold, less than the threshold, less than or equal to the threshold, equal to the threshold, not equal to the threshold, and/or the like.

It will be apparent that systems and/or methods described herein may be implemented in different forms of hardware, firmware, and/or a combination of hardware and software. The actual specialized control hardware or software code used to implement these systems and/or methods is not limiting of the aspects. Thus, the operation and behavior of the systems and/or methods were described herein without reference to specific software code—it being understood that software and hardware can be designed to implement the systems and/or methods based, at least in part, on the description herein.

Even though particular combinations of features are recited in the claims and/or disclosed in the specification, these combinations are not intended to limit the disclosure of various aspects. In fact, many of these features may be combined in ways not specifically recited in the claims and/or disclosed in the specification. Although each dependent claim listed below may directly depend on only one claim, the disclosure of various aspects includes each dependent claim in combination with every other claim in the claim set. A phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items, and may be used interchangeably with "one or more." Furthermore, as used herein, the terms "set" and "group" are intended to include one or more items (e.g., related items, unrelated items, a combination of related and unrelated items, and/or the like), and may be used interchangeably with "one or more." Where only one item is intended, the phrase "only one" or similar language is used. Also, as used herein, the terms "has," "have," "having," and/or the like are intended to be open-ended terms. Further, the phrase "based on" is intended to mean "based, at least in part, on" unless explicitly stated otherwise.

What is claimed is:

1. A method of wireless communications by a transmitting device, comprising:
   transforming a transmit waveform by an encoder neural network to control power amplifier (PA) operation with respect to non-linearities, the transforming comprising adding a complex sequence, generated by the encoder neural network, to modulation symbols, the encoder neural network trained to either ensure the PA operates in a linear region based on a loss function that penalizes a peak to average power ratio (PAPR) measured at an output of the transmitting device, or to ensure the PA operates near a saturation region based on a PA non-linearity model; and
   transmitting the transformed transmit waveform across a propagation channel.

2. The method of claim 1, further comprising:
   generating the encoder neural network and a decoder neural network; and
   transmitting the decoder neural network to a receiving device.

3. The method of claim 2, further comprising training the encoder neural network and the decoder neural network with synthetic channel data.

4. The method of claim 1, further comprising encoding by the encoder neural network in a frequency domain or a time domain.

5. The method of claim 1, further comprising mapping outputs of the encoder neural network to orthogonal frequency division multiplexed (OFDM) symbols corresponding to input data.

6. The method of claim 1, further comprising inserting a pilot signal before or after encoding by the encoder neural network.

7. The method of claim 6, in which the pilot signal is pre-coded and inserted after the encoding, the pre-coded pilot signal time-division multiplexed with output from the encoder neural network.

8. The method of claim 6, in which the pilot signal is inserted before the encoding, the pilot signal time-division multiplexed with data symbols before encoding by the encoder neural network, the encoder neural network receiving pre-coder weights or a pre-coder index as side information.

9. The method of claim 6, in which the pilot signal is inserted after the encoding, the pilot signal time-division multiplexed with output from the encoder neural network, the encoder neural network receiving pre-coder weights or a pre-coder index as side information.

10. A method of wireless communications by a receiving device, comprising:
    receiving a waveform transformed by an encoder neural network;
    generating complex symbols, with a decoder neural network, from encoder input symbols from the received waveform, the decoder neural network trained based on a loss function that either penalizes a peak to average power ratio (PAPR) measured at an output of a transmitting device, or is based on a power amplifier (PA) non-linearity model; and
    removing zero padding from the complex symbols.

11. The method of claim 10, further comprising:
    generating the encoder neural network and the decoder neural network; and
    transmitting the encoder neural network to the transmitting device.

12. The method of claim 11, further comprising training the encoder neural network and the decoder neural network with synthetic channel data or with actual channel measurements.

13. The method of claim 10, further comprising recovering the encoder input symbols based on side information comprising a pre-coded channel or a raw propagation channel.

14. The method of claim 10, in which a reconstruction target comprises symbols output from a channel encoder/ modulator at a transmitting device, pre-coded symbols at the transmitting device, complex symbols obtained by applying pre-coding to the symbols, or a linear combination of symbols output from the channel encoder/modulator by pre-coded channel coefficients.

15. A transmitting device for wireless communication, comprising:
a memory, and
at least one processor operatively coupled to the memory, the memory and the at least one processor configured:
to transform a transmit waveform by an encoder neural network to control power amplifier (PA) operation with respect to non-linearities, the transforming comprising adding a complex sequence, generated by the encoder neural network, to modulation symbols, the encoder neural network trained to either ensure the PA operates in a linear region based on a loss function that penalizes a peak to average power ratio (PAPR) measured at an output of the transmitting device, or to ensure the PA operates near a saturation region based on a PA non-linearity model; and
to transmit the transformed transmit waveform across a propagation channel.

16. The transmitting device of claim 15, in which the at least one processor is further configured:
to generate the encoder neural network and a decoder neural network; and
to transmit the decoder neural network to a receiving device.

17. The transmitting device of claim 16, in which the at least one processor is further configured to train the encoder neural network and the decoder neural network with synthetic channel data.

18. The transmitting device of claim 15, in which the at least one processor is further configured to encode by the encoder neural network in a frequency domain or a time domain.

19. The transmitting device of claim 15, in which the at least one processor is further configured to map outputs of the encoder neural network to orthogonal frequency division multiplexed (OFDM) symbols corresponding to input data.

20. The transmitting device of claim 15, in which the at least one processor is further configured to insert a pilot signal before or after encoding by the encoder neural network.

21. The transmitting device of claim 20, in which the pilot signal is pre-coded and inserted after the encoding, the pre-coded pilot signal time-division multiplexed with output from the encoder neural network.

22. The transmitting device of claim 20, in which the at least one processor is further configured to insert the pilot signal before the encoding, the pilot signal time-division multiplexed with data symbols before encoding by the encoder neural network, the encoder neural network receiving pre-coder weights or a pre-coder index as side information.

23. The transmitting device of claim 20, in which the at least one processor is further configured to insert the pilot signal after the encoding, the pilot signal time-division multiplexed with output from the encoder neural network, the encoder neural network receiving pre-coder weights or a pre-coder index as side information.

24. A receiving device for wireless communication comprising:
memory, and
at least one processor operatively coupled to the memory, the memory and the at least one processor configured:
to receive a waveform transformed by an encoder neural network;
to generate complex symbols, with a decoder neural network, from encoder input symbols from the received waveform, the decoder neural network trained based on a loss function that either penalizes a peak to average power ratio (PAPR) measured at an output of a transmitting device, or is based on a power amplifier (PA) non-linearity model; and
to remove zero padding from the complex symbols.

25. The receiving device of claim 24, in which the at least one processor is further configured:
to generate the encoder neural network and the decoder neural network; and
to transmit the encoder neural network to the transmitting device.

26. The receiving device of claim 25, in which the at least one processor is further configured to train the encoder neural network and the decoder neural network with synthetic channel data or with actual channel measurements.

27. The receiving device of claim 24, in which the at least one processor is further configured to recover the encoder input symbols based on side information comprising a pre-coded channel or a raw propagation channel.

28. The receiving device of claim 24, in which a reconstruction target comprises symbols output from a channel encoder/modulator at a transmitting device, pre-coded symbols at the transmitting device, complex symbols obtained by applying pre-coding to the symbols, or a linear combination of symbols output from the channel encoder/modulator by pre-coded channel coefficients.

* * * * *